United States Patent
Buhrman et al.

(10) Patent No.: US 9,577,653 B2
(45) Date of Patent: Feb. 21, 2017

(54) QUASI-LINEAR SPIN TORQUE NANO-OSCILLATORS

(71) Applicant: Cornell University, Ithaca, NY (US)

(72) Inventors: Robert A. Buhrman, Ithaca, NY (US); Oukjae Lee, Ithaca, NY (US); Daniel C. Ralph, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

(21) Appl. No.: 14/760,999

(22) PCT Filed: Jan. 14, 2014

(86) PCT No.: PCT/US2014/011555
§ 371 (c)(1),
(2) Date: Jul. 14, 2015

(87) PCT Pub. No.: WO2014/110603
PCT Pub. Date: Jul. 17, 2014

(65) Prior Publication Data
US 2015/0372687 A1   Dec. 24, 2015

Related U.S. Application Data

(60) Provisional application No. 61/752,430, filed on Jan. 13, 2013.

(51) Int. Cl.
*H03L 7/26* (2006.01)
*H03B 15/00* (2006.01)

(52) U.S. Cl.
CPC ............... *H03L 7/26* (2013.01); *H03B 15/006* (2013.01)

(58) Field of Classification Search
CPC .............................. H03L 7/26; H03B 15/006
USPC ..................................................... 331/3, 94.1
See application file for complete search history.

(56) References Cited

U.S. PATENT DOCUMENTS

| | | | |
|---|---|---|---|
| 2008/0150640 A1* | 6/2008 | Dimitrov | H03B 15/006 331/3 |
| 2009/0257274 A1 | 10/2009 | Itagaki et al. | |
| 2010/0188890 A1 | 7/2010 | Fukami et al. | |
| 2012/0062220 A1 | 3/2012 | Hoppensteadt et al. | |
| 2012/0154063 A1 | 6/2012 | Nikonov et al. | |

\* cited by examiner

*Primary Examiner* — Jeffrey Shin
(74) *Attorney, Agent, or Firm* — Perkins Coie LLP

(57) ABSTRACT

Techniques, systems, and devices are disclosed for implementing a quasi-linear spin-torque nano-oscillator based on exertion of a spin-transfer torque on the local magnetic moments in the magnetic layer and precession of the magnetic moments in the magnetic layer within a spin valve. Examples of spin-torque nano-oscillators (STNOs) are disclosed to use spin polarized currents to excite nano magnets that undergo persistent oscillations at RF or microwave frequencies. The spin currents are applied in a non-uniform manner to both excite the nano magnets into oscillations and generate dynamic damping at large amplitude as a feedback to reduce the nonlinearity associated with mixing amplitude and phase fluctuations.

30 Claims, 18 Drawing Sheets

Exemplary Thin Film Structure

AJA DC/RF sputtering system: Magnetic materials & Metal depositions

Structure: Substrate/ Py(5) / Cu(120) / Py(5) / Cu(12) / Py(20) / Cu(2) / Pt(30)

QUASI-LINEAR SPIN TORQUE NANO-OSCILLATORS

PRIORITY CLAIM AND RELATED PATENT APPLICATION

This patent document is a 35 USC 371 National Stage application of International Application No. PCT/US2014/011555 filed Jan. 14, 2014, which claims priority of U.S. Provisional Patent Application No. 61/752,430 entitled "QUASI-LINEAR SPIN TORQUE NANO-OSCILLATORS" and filed on Jan. 14, 2013, the entire disclosure which is incorporated by reference as part of this patent document.

STATEMENT REGARDING FEDERALLY SPONSORED RESEARCH OR DEVELOPMENT

This invention was made with government support by the Office of Naval Research (ONR) under contract number N00014-13-1-0045 and by the Army Research Office (ARO) under contract number W911NF-08-2-0032. The government has certain rights in this invention.

TECHNICAL FIELD

This patent document relates to systems, devices, and processes that use spin torque magnetic structures.

BACKGROUND

Electrons and other charged particles process spins as one of their intrinsic particle properties and such a spin is associated with a spin angular momentum. A spin of an electron has two distinctive spin states. Electrons in an electrical current may be unpolarized by having the equal probabilities in the two spin states. The electrons in an electrical current are spin polarized by having more electrons in one spin state than electrons in the other spin state. A spin-polarized current can be achieved by manipulating the spin population via various methods, e.g., by passing the current through a magnetic layer having a particular magnetization. In various magnetic microstructures, a spin-polarized current can be directed into a magnetic layer to cause transfer of the angular momenta of the spin-polarized electrons to the magnetic layer and this transfer can lead to exertion of a spin-transfer torque on the local magnetic moments in the magnetic layer and precession of the magnetic moments in the magnetic layer. Under a proper condition, this spin-transfer torque can cause a flip or switch of the direction of the magnetization of the magnetic layer.

SUMMARY

Techniques, systems, and devices are disclosed for implementing a quasi-linear spin-torque nano-oscillator based on exertion of a spin-transfer torque on the local magnetic moments in the magnetic layer and precession of the magnetic moments in the magnetic layer within a spin valve. Examples of spin-torque nano-oscillators (STNOs) are disclosed to use spin polarized currents to excite nano magnets that undergo persistent oscillations at RF or microwave frequencies. The spin currents are applied in a non-uniform manner to both excite the nano magnets into oscillations and generate dynamic damping at large amplitude as a feedback to reduce the nonlinearity associated with mixing amplitude and phase fluctuations.

In one aspect, a method is provided for generating an RF or microwave oscillation signal and includes configuring a magnetic spin-torque structure to include a multi-layer stack of layers on a substrate to exhibit a spin-torque effect, wherein the multi-layer stack is shaped to have a shape anisotropy in each layer and includes a thin magnetic free layer and a thick magnetic reference layer; applying a DC bias current to flow through the magnetic spin-torque structure; applying a bias magnetic field to the magnetic spin-torque structure; and controlling the DC bias current and the bias magnetic field to control a magnetic precession in the magnetic spin-torque structure to convert the DC bias current into an RF or microwave oscillation signal and effectuate a negative spin torque feedback to render a coupling between amplitude and phase fluctuations of the RF or microwave oscillation signal to be very weak or nearly zero, resulting in a nearly linear oscillator whose frequency varies at most only weakly with oscillator amplitude (power) at the optimum operating condition. In implementations, the DC bias current or the bias magnetic field can be adjusted to tune an oscillation frequency of the RF or microwave oscillation signal produced by the magnetic spin-torque structure.

In another aspect, a spin-torque oscillator device for generating an RF or microwave oscillation signal is provided to include a substrate; a magnetic spin-torque structure formed on the substrate and structured to include a multi-layer stack of layers on the substrate to exhibit a spin-torque effect, wherein the multi-layer stack is shaped to have a shape anisotropy in each layer and includes a thin magnetic free layer and a thick magnetic reference layer; a circuit coupled to the magnetic spin-torque structure to apply a DC bias current to flow through the magnetic spin-torque structure; and a magnetic field module configured to apply a bias magnetic field to the magnetic spin-torque structure. The magnetic spin-torque structure, the DC bias current and the bias magnetic field are configured to control a magnetic precession in the magnetic spin-torque structure to convert the DC bias current into an RF or microwave oscillation signal and effectuate a negative spin torque feedback to render a coupling between amplitude and phase fluctuations of the RF or microwave oscillation signal to be nearly zero.

In another aspect, a method is provided for generating a tunable RF or microwave oscillation signal from a magnetic spin-torque structure. This structure includes a multi-layer stack of layers including a magnetic free layer and a magnetic reference layer spaced from each other and shaped to have a shape anisotropy to exhibit a spin-torque effect and a magnetic precession in the magnetic spin-torque structure under a bias magnetic field. The method includes applying a DC bias current to flow through the magnetic spin-torque structure; applying a bias magnetic field to the magnetic spin-torque structure to include a bias magnetic field component that is in a plane of the magnetic free layer and perpendicular to an elongated direction of the magnetic free layer; and controlling the DC bias current and the bias magnetic field to control a magnetic precession in the magnetic spin-torque structure to convert the DC bias current into an RF or microwave oscillation signal and to reduce a coupling between an amplitude and an oscillation frequency of the RF or microwave oscillation signal.

In yet another aspect, a spin-torque oscillator device for generating an RF or microwave oscillation signal is provided to include a substrate and a magnetic spin-torque structure formed on the substrate and structured to include a multi-layer stack of layers on the substrate to exhibit a spin-torque effect. The multi-layer stack is shaped to have a shape anisotropy in each layer and includes a magnetic free layer, a magnetic reference layer and a conductive spacer layer between the magnetic free layer and the magnetic reference layer, and the magnetic reference layer has a tapered shape along a direction perpendicular to the magnetic reference layer. This device also includes a circuit coupled to the magnetic spin-torque structure to apply a DC bias current to flow through the magnetic spin-torque structure; and a magnetic field module configured to apply a bias magnetic field to the magnetic spin-torque structure. The magnetic spin-torque structure, the DC bias current and the bias magnetic field are configured to control a magnetic precession in the magnetic spin-torque structure to convert the DC bias current into an RF or microwave oscillation signal which has an oscillation frequency that is stabilized with respect to a power of the RF or microwave signal.

The above and other aspects and their implementations are described in greater detail in the drawings, the description and the claims.

BRIEF DESCRIPTION OF THE DRAWINGS

FIGS. 13a, 13b and 13c: (a) Normalized oscillator power $p_{o,mms}$ vs. I, as determined from the MMS for $H_y$=800 Oe. Also shown is the mean offset angle $\langle \phi_0 \rangle$ averaged over the simulated FL. (b) The out-of-plane orientation ($\theta_{RL}$) of the RL magnetization as the function of position along its elongated (easy) axis, as determined by MMS for $H_y$=800 Oe. (c) Schematic illustration of $H_{Oe}$ and $H_{ST}^{ip}$ as seen by ends of the FL for I<0. The estimated $H_{Oe}$≈26 Oe/mA is partially cancelled by $H_{st}^{ip}$≈15 Oe/mA in the end regions of the FL. The modeled value of $\theta_{RL}$≈12° is determined by averaging the result of the static micromagnetic simulation over several unit cells at the end of the RL

DETAILED DESCRIPTION

Figure 1A:
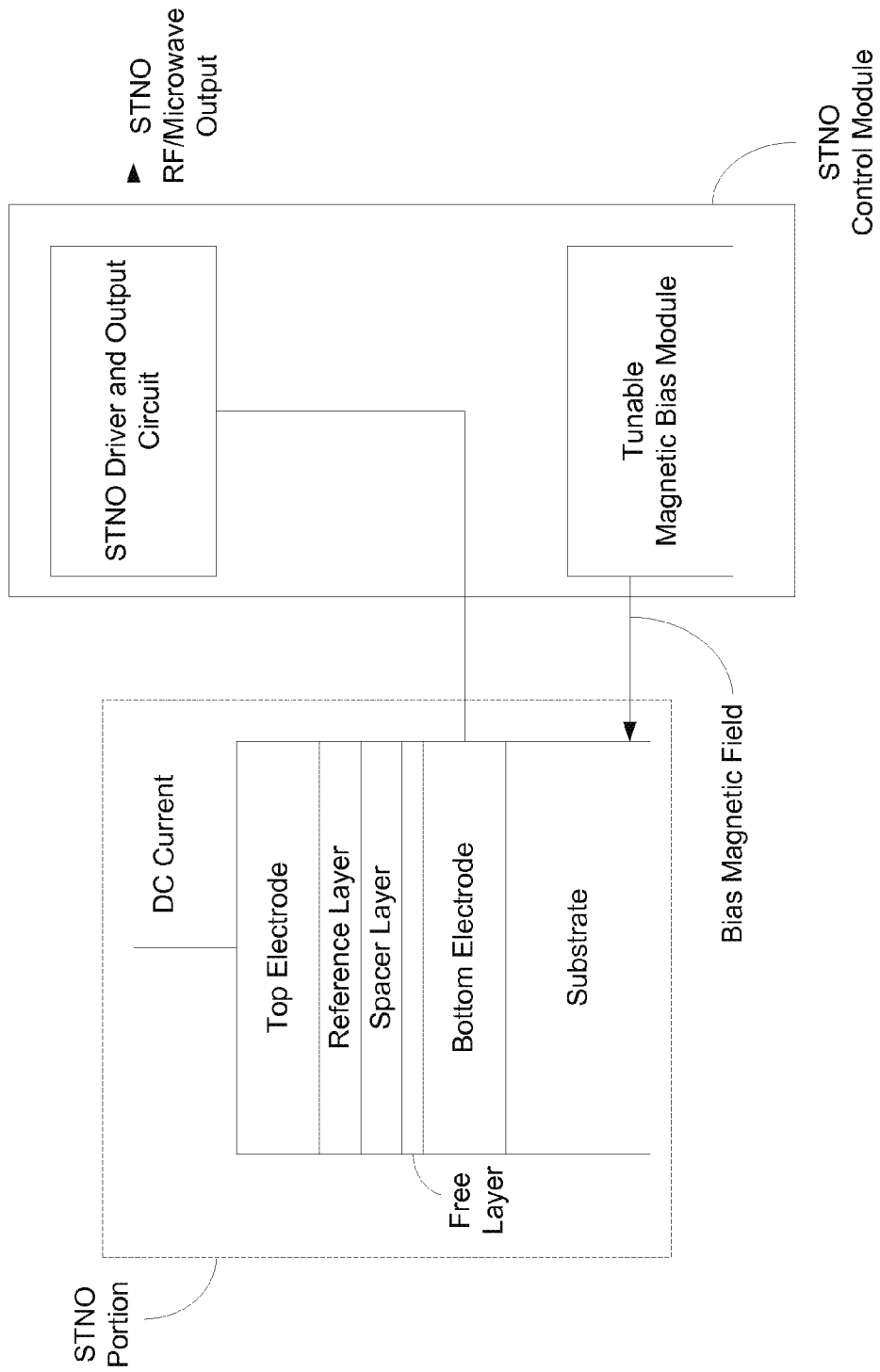
FIG. 1A shows an example of a STNO device based on the disclosed STNO technology.

The spin-transfer torque (STT) effect can be used for various applications including STT magnetic random access memory (MRAM) circuits and devices and generation of RF or microwave oscillations in a magnetic structure having a spacer layer between a free layer or free magnetic layer (FL) having a switchable or changeable magnetization and a reference layer (RL) having a fixed magnetization, also known as a pinned layer (PL). For example, a STT-MRAM circuit can include a magnetic tunnel junction (MTJ) as a magnetoresistive element formed of two or more thin film ferromagnetic layers including a free layer (FL) and a reference layer (RL) that are separated by an insulating barrier layer (e.g., a MgO layer) that is sufficiently thin to allow electrons to transit through the barrier layer via quantum mechanical tunneling when an electrical bias voltage is applied between the electrodes. The electrical resistance across the MTJ depends upon the relative magnetic orientations of the RL and FL layers. The magnetic moment of the FL can be switched between two stable orientations in the FL. The resistance across the MTJ exhibits two different values under the two relative magnetic orientations of the RL and FL layers, which can be used to represent two binary states "1" and "0" for binary data storage, or, alternatively, for binary logic applications. The magnetoresistance of this element is used to read out this binary information from the memory or logic cell.

Techniques, systems, and devices are disclosed for implementing a quasi-linear spin-torque nano-oscillator based on a spin valve stack including a non-magnetic conductive spacer layer between magnetic FL and RL layers. Based on the disclosed technology, spin torque nano-oscillators (STNOs) can be constructed by utilizing the spin-transfer effect to produce RF or microwave oscillations in nanoscale ferromagnetic elements. Such a STNO device can be configured to be compact in size relative to other RF or microwave oscillator circuits and thus can be integrated into a wide range of electronic or magnetic circuits or devices, such as logic circuits, MTJ devices, highly sensitive and compact magnetic sensors that measures a magnetic field based on a change in the generated RF or microwave oscillator signal, and other devices and applications. As a specific example, the disclosed technology can be implemented to construct a giant magnetoresistance (GMR) sensor as part of a magnetic read head for reading stored bit in a magnetic storage medium such as a magnetic hard drive disk, where such a STNO device in integrated at or near the air bearing surface of the magnetic read head.

The spatial magnetic anisotropy of a magnetic stack structure for a STNO device based on the disclosed STNO technology can be configured to include both in-plane spatial anisotropy and out-of-plane spatial anisotropy in at least one of the magnetic layers (e.g., the RL) to enable a non-uniform spin torque and a strong negative feedback for oscillator power fluctuations to reduce or minimize non-linear coupling between amplitude and phase fluctuations that limits phase stability and broadens the oscillator linewidth ($\Delta f$). For example, both the magnetic RL and FL layers in a spin valve in a disclosed STNO device can have in-plane anisotropy by having an elongated in-plane shape to produce a magnetic anisotropy along the elongate direction and, at the same time, the RL layer can have an out-of-plane spin-polarization due to a tapering. The examples of STNO devices based on the disclosed technology can utilize power-dependent negative feedback to achieve a significantly enhanced dynamic damping and combine a sufficiently slow variation of frequency with power to achieve a quasi-linear STNO operation with weak nonlinear coupling of power and phase fluctuations over a range of bias current and field. An implementation of this approach that utilizes a non-uniform spin-torque applied to the oscillating magnetic free layer of a nanoscale spin valve device demonstrates that highly coherent room temperature STNOs can be achieved while retaining a sufficient tunability. Examples of such quasi-linear STNOs exhibit room temperature oscillator linewidths, $\Delta f \approx 5$ MHz, much narrower than typically obtained in low magnetic fields. Such STNO devices can include a magnetic configuration such that: (i) there is a strong spatial variation in the polarization direction and anti-damping effectiveness of the incident spin current density that results in high effective dynamic damping of the oscillation; and (ii) the frequency shifts with power due to the oscillating element's magnetic anisotropy fields are approximately balanced over a broad range of field and current bias. In combination this greatly reduces or eliminates the non-linear coupling, yet the STNO still can be frequency tuned with current over a range $>>\Delta f$. Such characteristics of the disclosed STNO devices are different from some other designs of frequency agile STNOs which tend to exhibit a strong non-linear coupling between amplitude and phase fluctuations that limits phase stability and broadens the oscillator linewidth ($\Delta f$).

In a spin-torque nano-oscillator (STNO), a spin-polarized current (I) excites persistent magnetic precession at microwave frequencies in an unpinned magnetic element when the anti-damping spin torque ($\tau_{st}$) is sufficient to compensate for the magnetic damping torque $(\tau_d)^{i,ii,iii,iv}$. One attractive feature of STNOs is their high agility, i.e. a strong variation of oscillation frequency with the oscillator power. This STNO feature results in a strong non-linear coupling between amplitude and phase fluctuations that broadens the oscillator linewidth $\Delta f$ and thus can limit phase stability of the STNOs. Various practical technological applications tend to considerable improvements in the STNO phase stability to make such a STNO feasible for commercial devices. The STNO technology disclosed in this document can be used to provide implementations of a STNO device as a quasi-linear oscillator with low field, room temperature linewidths much narrower than typically obtained with a conventional STNO. One implementation, for example, utilizes a magnetic configuration such that there is a strong spatial variation in the spin polarization direction of the excitation current that yields a high effective dynamic damping ($\Gamma'_{\mathit{eff}}$) of the oscillation, and also such that the frequency shifts with oscillator amplitude due to the magnetic anisotropy fields can be approximately balanced over a broad range of magnetic field bias. This combination can be implemented to significantly reduce the non-linear coupling between amplitude and phase fluctuations resulting in a STNO with a room temperature $\Delta f \approx 5$ MHz which is a linewidth close to that predicted for a linear STNO of the same oscillator energy. Notably, the disclosed STNO implementations can be frequency tuned by controlling the current over a spectral range much greater than the $\Delta f$. These results demonstrate an effective pathway to substantially enhancing the phase stability of STNOs.

FIG. 1A shows an example of a STNO device based on the disclosed STNO technology in this document. In this example, the STNO device includes a STNO portion having one or more STNO elements, and a STNO driver and output circuit that is coupled to the STNO portion to provide a DC spin-polarized current into each STNO element and to obtain a reading out of each STNO element as the STNO RF/Microwave output signal. In the STNO portion, each STNO element includes a magnetic spin-torque structure formed on a substrate and structured to include a multi-layer stack of layers on the substrate to exhibit a spin-torque effect. In the illustrated example, the STNO multi-layer stack includes a bottom electrode formed over the substrate, a free layer exhibiting a changeable magnetization, a spacer layer over the free layer, a reference layer over the spacer layer and a top electrode. The DC current is directed perpendicular to the layers to flow through the STNO multi-layer stack. In addition, a magnetic bias module is provided to produce a magnetic bias field to the one or more STNO elements in the STNO portion and can change or tune the magnetic field either alone or in combination with controlling the current through the STNO element to achieve a desired oscillation operating condition in the STNO element. The multi-layer stack is shaped to have a shape anisotropy in each layer and may further include a shape tapering in the reference layer along a direction perpendicular to the layers. The magnetic spin-torque structure, the DC bias current and the bias magnetic field are configured to control a magnetic precession in the magnetic spin-torque structure to convert the DC bias current into an RF or microwave oscillation signal and effectuate a negative spin torque feedback to render a coupling between amplitude and phase fluctuations of the RF or microwave oscillation signal to be very weak or nearly zero, resulting in a nearly linear oscillator whose frequency varies at most only weakly with oscillator amplitude (power) at the optimum operating condition.

Figure 1B:
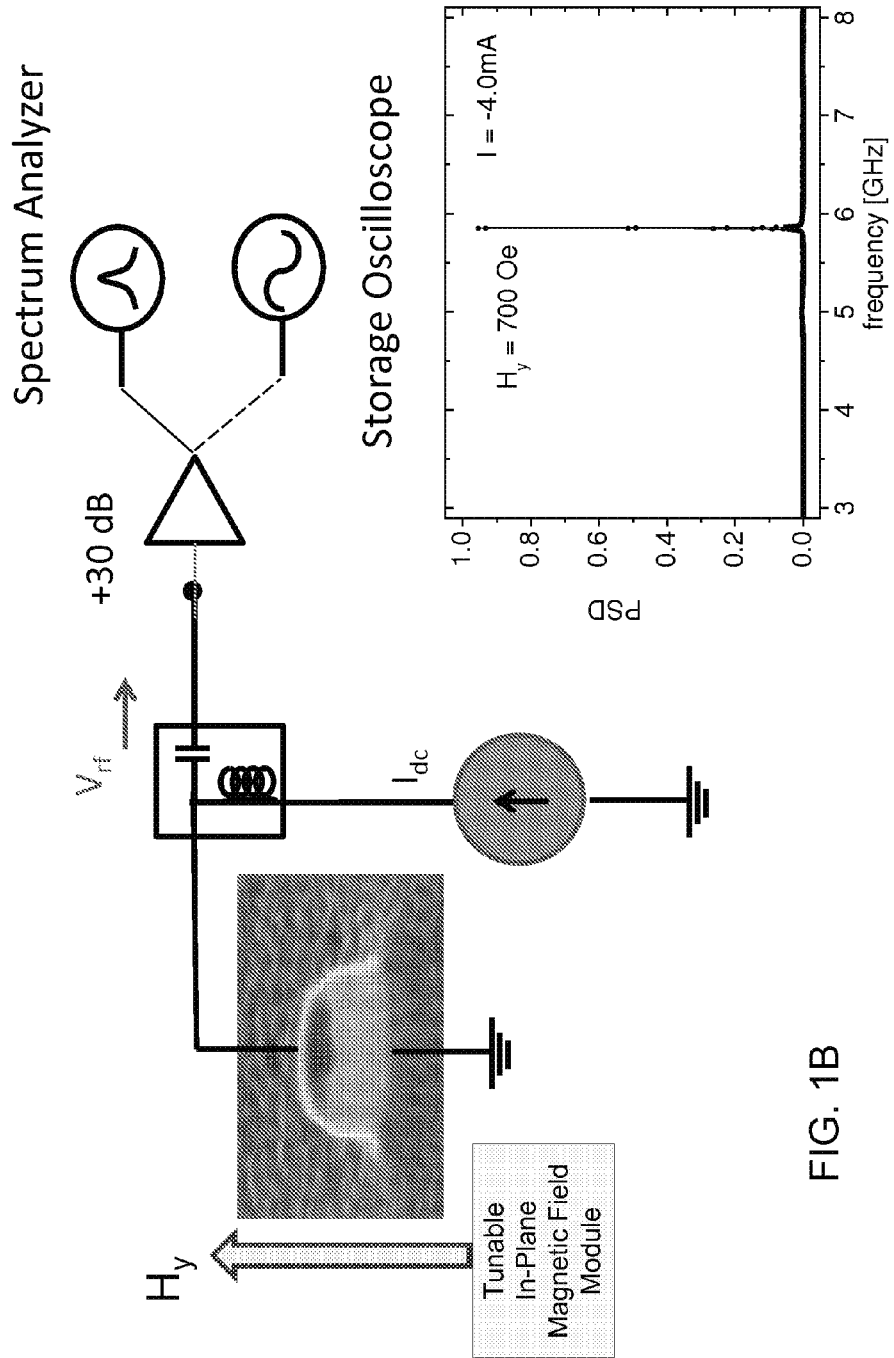
FIG. 1B shows an example of an implementation of a STNO device in FIG. 1A.

FIG. 1B shows an example of an implementation of a STNO device in FIG. 1A. Specifically, this spin-torque oscillator device for generating an RF or microwave oscillation signal includes a circuit coupled to the magnetic spin-torque structure to apply a DC bias current to flow through the magnetic spin-torque structure; and a magnetic field module configured to apply a bias magnetic field in the plane of the magnetic layers (e.g., along the y direction of the xy plane of the magnetic layers) to the magnetic spin-torque structure. The circuit further includes a current source and a read out circuit with inductive and capacitive elements to output an oscillation voltage representing the RF or microwave oscillation in the STNO element. This RF or microwave output signal can be further analyzed by, e.g., a spectrum analyzer or an oscilloscope. The magnetic spin-torque structure, the DC bias current and the bias magnetic field are configured to control a magnetic precession in the magnetic spin-torque structure to convert the DC bias current into an RF or microwave oscillation signal and effectuate a negative spin torque feedback to render a coupling between amplitude and phase fluctuations of the RF or microwave oscillation signal to be nearly zero.

Figure 1C:
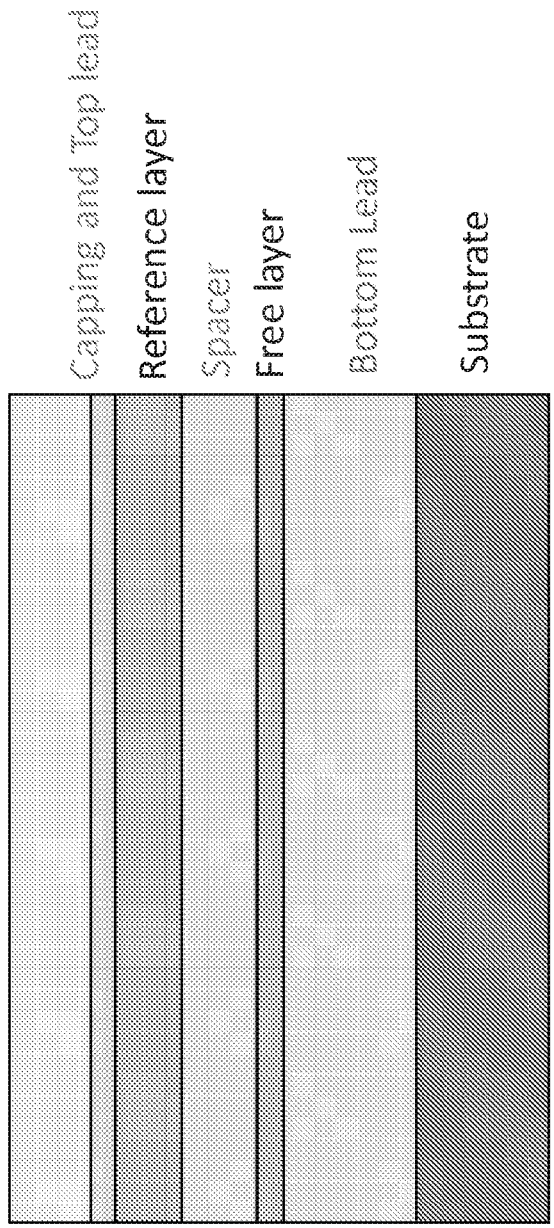
FIG. 1C illustrates an example of a multi-layer structure of a spin torque nano-oscillator as one implementation of the STNO device design in FIG. 1A.

FIG. 1C illustrates an example of a multi-layer structure of a spin torque nano-oscillator as one implementation of the STNO device design in FIG. 1A. The multi-layer structure includes a substrate and a magnetic spin-torque structure formed on the substrate and structured to include a multi-layer stack of layers on the substrate in a layer configuration of Py(5)/Cu(120)/Py(5)/Cu(12)/Py(2)/Cu(2)/Pt(30) where the bottom electrode is Py(5)/Cu(120), the free layer is a thin Py(5) layer, the spacer is Cu(12), the reference layer is Py(20) and the top electrode layer is Cu(2)/Pt(30). As described in detail below, the stack can be shaped to have an in-plane anisotropy such as an elliptical shape and the RL layer can be vertically tapered to achieve a material structure for the desired STNO operation.

Referring back to FIG. 1A, the STNO device can be operated to generate a tunable RF or microwave oscillation signal from the magnetic spin-torque structure. This structure includes a multi-layer stack of layers including a magnetic free layer and a magnetic reference layer spaced from each other and shaped to have a shape anisotropy to exhibit a spin-torque effect and a magnetic precession in the magnetic spin-torque structure under a bias magnetic field. The method includes applying a DC bias current to flow through the magnetic spin-torque structure; applying a bias magnetic field to the magnetic spin-torque structure to include a bias magnetic field component that is in a plane of the magnetic free layer and perpendicular to an elongated direction of the magnetic free layer; and controlling the DC bias current and the bias magnetic field to control a magnetic precession in the magnetic spin-torque structure to convert the DC bias current into an RF or microwave oscillation signal and to reduce a coupling between an amplitude and an oscillation frequency of the RF or microwave oscillation signal. Either or both of the DC bias current and the bias magnetic field can be controlled to set the STNO in a desired operating condition where the coupling between the amplitude and the oscillation frequency of the RF or microwave oscillation signal is reduced to a tolerable level or minimized so that the oscillator behaves like a quasi linear oscillator. In addition, either or both of the DC bias current and the bias magnetic field can be controlled to increase the power of the RF or microwave signal. Furthermore, either or both of the DC bias current and the bias magnetic field can be controlled to tune the oscillation frequency of the RF or microwave signal.

The STNO device in FIG. 1A can be operated as an RF or microwave signal generator as described above. Alternatively, the STNO device in FIG. 1A can be used as a magnetic sensor where a change in the bias magnetic field at the magnetic spin-torque structure can be reflected in a change in the produced RF or microwave signal. This change in the produced RF or microwave signal, in turn, can be used to infer the change in the bias magnetic field. In operation, the magnetic bias module in FIG. 1A is used to produce a magnetic bias field and the combination of the DC current and this magnetic bias field sets the STNO in a desired sensing operating condition. The STNO device is exposed to an external magnetic field to be measured. This external magnetic field and the magnetic bias field collectively form the total bias magnetic field experienced by the STNO device. As the external magnetic field to be measured changes, the total bias magnetic field experienced by the STNO device changes to cause a change in the generated RF or microwave signal. Therefore, the STNO device can be operated as a magnetic sensor to measure a change in a magnetic field by measuring a change in the RF or microwave signal.

The basic behavior of a STNO can be described with the Landau-Lifshitz-Gilbert-Slonczewski (LLGS) equation. On that basis, a recent non-linear auto-oscillator (NLAO) analysis has described how the amplitude fluctuations of a STNO mode additionally renormalizes its thermally generated intrinsic phase noise via a dimensionless nonlinear coupling (v), and predicts that for a single mode STNO based on an isotropic thin film nanomagnet the spectral linewidth (Δf) of a STNO can be described by $$\Delta f = \frac{\Gamma_0}{2\pi}\left(\frac{k_B T}{E}\right)(1+v^2) = \left(\frac{\gamma^2 \alpha_G k_B T}{2\pi V}\right)\cdot\left(\frac{1+v^2}{fp}\right). \quad (1)$$

where E is the time averaged energy of the oscillator, $\Gamma_o = \alpha_G \cdot \gamma \cdot 2\pi M_s$, $M_s$ is the saturation magnetization of the oscillating magnetic free layer (FL), p (≤1) is the normalized oscillator power, f is the frequency, V is the FL volume, $\alpha_G$ is the Gilbert damping parameter, $k_B$ is the Boltzmann constant, T is the temperature, γ is the electron gyromagnetic ratio. In general the nonlinear coupling factor (v) is given by $$v \equiv \frac{N'}{\Gamma'_{eff}} \equiv \frac{\partial f/\partial p}{(2\pi)^{-1}\partial \Gamma(p,I)/\partial p}, \quad (2)$$

where N'≡∂f/∂p is the agility of the STNO, and where the total damping Γ(p, I)=Γ$_+$(p)−Γ$_-$(p, I), which is zero during steady state oscillation, is the difference between the natural positive (dissipative) damping $\Gamma_+(p)=\Gamma_o(1+\eta/(p))\approx\Gamma_o$, (neglecting any power dependence of the positive damping, i.e. assuming η(p)<<1), and the negative damping Γ$_-$(p, I)=σI caused by $\tau_{ST}$. Here $\sigma=\sigma_0 g(p)$ is the anti-damping effectiveness of the spin-polarized current with g(p) representing its power dependence (g(0)=1). In general $\sigma_0=\Gamma_0/I_c$, where $I_c$ is the current required for oscillation onset.

The linewidth Δf, microwave power P, and agility of various types of STNOs have been extensively studied, with many results in general accord with the NLAO analysis. In the case of a 4.2K spin valve study where the precession axis of the FL was collinear with respect to the orientation of the spin polarization of I quantitative agreement with the NLAO model was obtained over a range of bias conditions and for p≤0.35, albeit with $\Delta f_{min}$≥25 MHz, indicative of |v|>>1. The reduction of |v| in STNO can be achieved by reducing N' through the application of either in-plane hard axis magnetic field (H$_y$) biases, or strong out-of-plane field biases, to balance out opposing red and blue shifts with p due to the effect of the different anisotropy fields. Various tests measurements demonstrated that a lower Δf is obtained in bias regimes where N' is low. However since even with a hard axis bias we typically have |N'=∂f/∂p|>1 GHz, except perhaps in a quite narrow bias range, and since we also usually have $\Gamma_{eff}'(\equiv(2\pi)^{-1}\propto\Gamma(p,I)/\partial p)\sim\Gamma_0/2\pi<<1$ GHz, the STNO remains nonlinear with |v|>>1.

One of approaches to achieving a quasi-linear STNO is to also increase the dynamic effective damping $\Gamma_{eff}'$≥1 GHz. This can be obtained by employing a magnetic structure such that the variation of STNO power with I above oscillation onset is much weaker than in a typical STNO. The effective dynamic damping of a STNO can be expressed as $$\Gamma'_{eff} = \left(\frac{\Gamma_0}{2\pi}\right)\left(I\frac{\partial p}{\partial I}\right)^{-1} \text{ and } v = \frac{2\pi I}{\Gamma_0}\left(\frac{\partial p}{\partial I}\right)\left(\frac{\partial f}{\partial p}\right) = \left(\frac{2\pi}{\Gamma_0}\right)\left(I\frac{\partial f}{\partial I}\right) \quad (3)$$

In combination with an in-plane bias magnetic field H$_y$ in the range that provides an approximate balance between the oscillator power dependence of the red-shift due to the out-of-plane demagnetization field and that of the blue-shift due to the in-plane anisotropy field such that |N'|<4 GHz, a small I ∂p/∂I and hence large $\Gamma_{eff}'$~2-6 GHz will result |v|≤1.

To demonstrate and study this means of implementing a quasi-linear STNO, a tapered sample STNO element structure was fabricated to in a configuration of Py(5)-Cu(12)-Py(20) (thickness in nm and Py=Ni$_{80}$Fe$_{20}$) as a nanopillar spin-valve STNO having a thin FL located closer to the substrate than the thicker ferromagnetic reference layer (RL). This geometry results in a significant out of plane magnetization component in the bottom two end regions of the elliptical RL, which as discussed below modifies the effective of the spin torque across the FL. The dipolar field (H$_d$≈250 Oe) from the RL acts to orient the FL anti-parallel (AP) to it ($\phi_o$=180°), with H$_y$ acting to reduce the offset angle $\phi_o$ towards 90°, for H$_y$≤1000 Oe. Because of this alignment, coherent oscillations in the FL were generated with a current bias (I<0) such that electrons flowed from the RL to the FL. In the following we will report results from one particular device although the general behavior was quite similar from device to device, with the moderate variations in optimum bias conditions, minimum Δf and p attributed to device geometry variations in the fabrication process.

Figure 2:
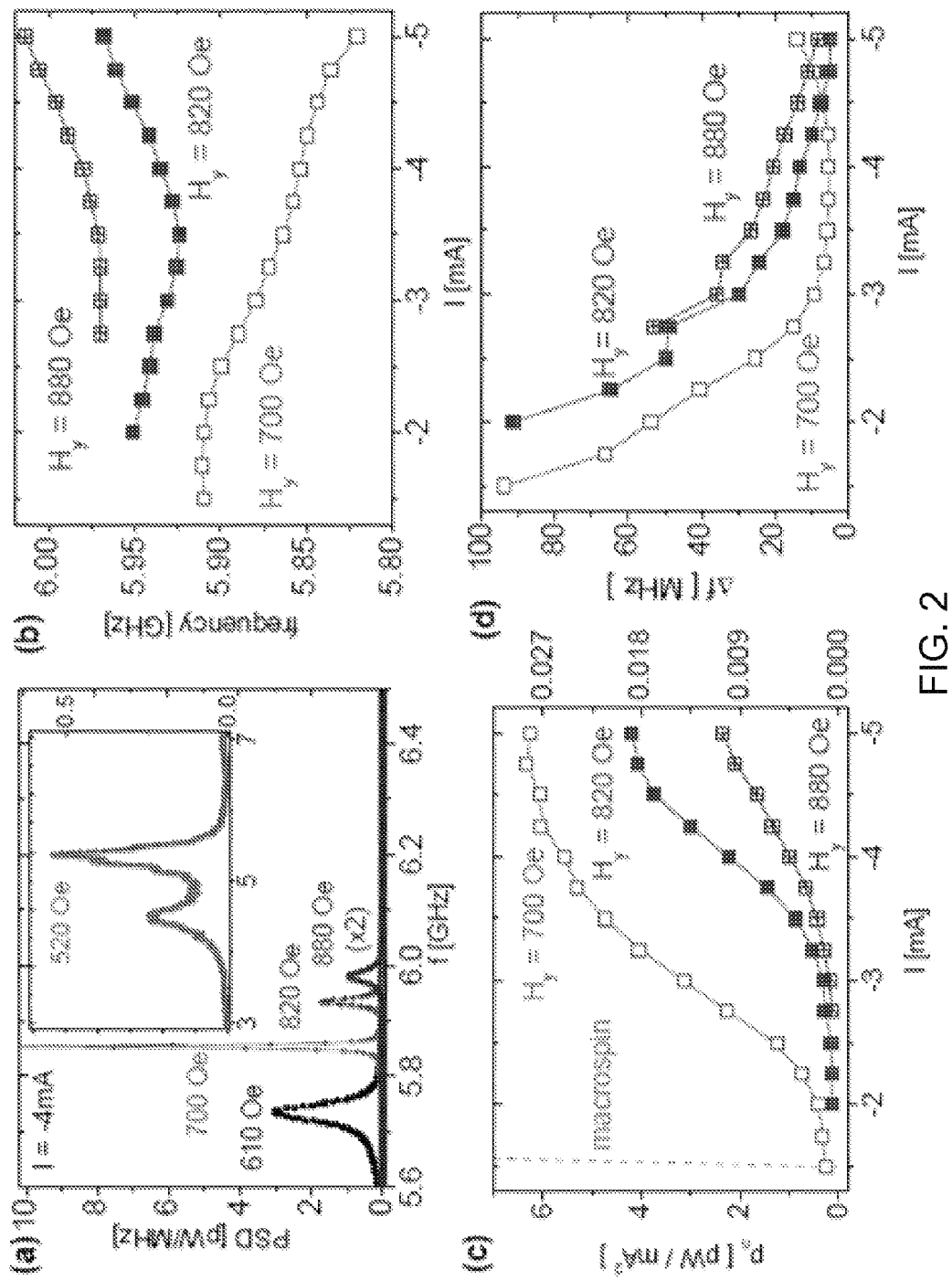
FIG. 2 includes FIGS. 2a, 2b, 2c and 2d showing sample measurements in a sample STNO device under an in-plane magnetic bias field $H_y$. (a) Measured PSD's for $H_y$=520, 610, 700, 790 and 880 Oe at $I_{dc}$=−4 mA; (b) oscillator frequency f; (c) oscillator power $p_n$ (=$P/I_{dc}^2$) and normalized power p; and (d) $\Delta f_{meas}$ as the function of $I_{dc}$, all for $H_y$=700 Oe, 820 Oe and 880 Oe.

FIG. 2a shows the measured power spectral densities (PSD's) of a typical device at 520, 610, 700, 820 and 880 Oe for I=−4 mA. As illustrated in the inset, for lower H$_y$ (250 Oe<H$_y$<650 Oe) the STNO exhibited two, or more, modes, which is associated with the relatively wide spatial distribution of the natural oscillation frequency (internal field) across the FL, and which results in broad Δf's due to mode-mode interactions. At and above 650 Oe this distribution is much more uniform and generally a single microwave mode is observed for the current biases employed, as illustrated in FIG. 2a, with f increasing with H$_y$ as expected for a ST excited in-plane oscillation. In this bias regime the power in the 2$^{nd}$ harmonic was much weaker than the fundamental due to the offset angle (90°<$\phi_o$<135°) between the RL and the precession axis of the FL. For the remainder of this paper we will focus on the single mode STNO excitation and its coherent properties for 650 Oe≤H$_y$≤900 Oe.

FIGS. 2b-d show measurements off the normalized microwave power p$_n$ (=P/I$^2$), and Δf, as obtained from Lorentzian fits to the measured PSD's of the STNO as the function of I for three different H$_y$ magnitudes of 700 Oe, 820 Oe, and 880 Oe, in the single mode regime. At 700 Oe, the measured f exhibits a weak red-shift with I, ∂f/∂|I|<20 MHz/mA, much less than what is obtained at lower fields, >100 MHz/mA, while Δf goes through a broad minimum with the lowest Δf (≈5 MHz) being reached at approximately the current where p$_n$ begins to vary only weakly for |I|>3.5 mA. For |I|>4.25 mA there is a slight rise in Δf which is correlated with the onset of a non-uniform mode and thus the onset of weak mode jumping. The general behavior of a saturating p$_n$, beginning at a steadily increasing optimum current $I^{opt}$≈2~2.5×I$_c$, and a minimum Δf, was obtained for H$_y$ from 650 Oe to 800 Oe, over which $I^{opt}$ increased from −3.5 mA to −5 mA, the highest current employed in the experiment, while Δf$_{min}$ varied slightly from 8 MHz to 5 MHz. At 820 Oe, there was a current dependent transition from a weak red-shift to a weak blue-shift (FIG. 2b) while p$_n$ appeared to just begin to saturate at 5 mA with Δf approaching 5 MHz at that point. At 880 Oe (FIG. 2b) the STNO exhibited a monotonic blue-shift (∂f/∂|I|>0) and a monotonically decreasing Δf (FIG. 2d) while p$_n$ was much lower overall but increased through the higher part of the range of I (FIG. 2c). Thus as illustrated in FIGS. 2b-2d, this STNO device exhibits a broad range of field bias where Δf can be quite low, in comparison to most previous room temperature spin valve STNO results, and still be frequency tunable |I ∂f/∂I|>>Δf.

Figure 3:
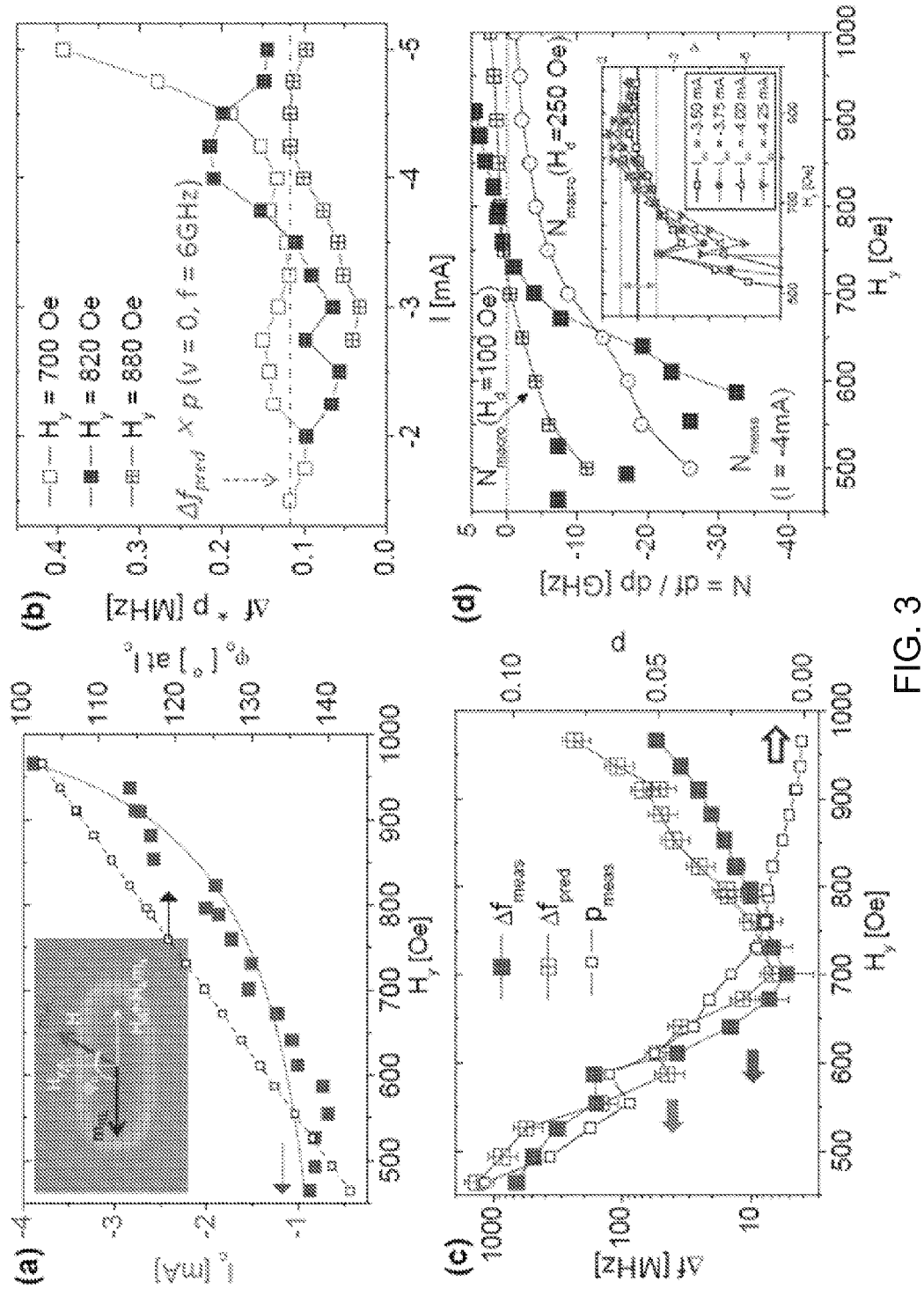
FIG. 3 includes FIGS. 3a, 3b, 3c and 3d showing sample measurements in the same sample STNO device in FIG. 2. (a) Measured $I_c$ for the on-set of the auto-oscillation and fitted $\phi_o$ as function of $H_y$. Inset: Scheme of the internal/external fields and magnetic configuration in the STNO. (b) Measured $\Delta f \times p$ at $H_y$=700 Oe, 820 Oe and 880 Oe. The dotted line corresponds to the predicted $\Delta f \times p$ from Eq. 1 for v=0 and f=6 GHz. (c) Measured oscillator linewidth $\Delta f_{meas}$, as obtained from Lorentzian fits to the output of the spectrum analyzer, and p as the function of $H_y$ at $I_{dc}$=−4 mA. The linewidth $\Delta f_{pred}$ as predicted from Eq. 1 is also shown. (d) Experimental N'=∂f/∂p as the function of $H_y$ at −4 mA. N' as obtained from macrospin simulations for $H_k$=450 Oe, and for $H_d$=00 Oe and 250 Oe. Inset: Experimental non-linearity v as determined from $\Delta f_{meas}$ and Eq. 3 as the function of $H_y$ at several $I_{dc}$'s.

Approximate values for the normalized oscillator power p can be obtained within the context of the macrospin model. This requires as inputs $p_n$ and $\phi_o$. We obtain the latter through the use of the predicted $\phi$ dependence of the onset current, $I_c=I_{c0}/|\cos\phi_0|$. FIG. 3a shows a plot of $I_c$ vs. $H_y$, as determined by the point where the oscillator mode is first clearly established, along with the value of $\phi_o$ for each $H_y$ as indicated by the fit of the predicted variation of $I_c$. FIG. 3b shows a plot of Δf×p as determined from the measured data of FIGS. 2b-d for the three different field values. Over a wide range of current and field, we see that while p varies by a factor of 30, Δf×p varies by ≤2 and is close to the predicted linear oscillator value $\Delta f_{pred} \times p \approx 0.12$ MHz (for v=0 and f=6 GHz), demonstrating that Eqn. 1 provides a rather good description of Δf of this STNO, despite the approximations in estimating p, and that the non-linear coupling constant |v|≤1 in this bias regime.

To further demonstrate the agreement with the NLAO analysis FIG. 3c shows the measured Δf and estimated normalized power p as the function of $H_y$ for a fixed bias current I=−4 mA. As $H_y$ increases from 400 Oe Δf decreases rapidly, reaching its minimum ≈5 MHz at $H_y^{opt} \approx 700$ Oe, and then increases again with higher $H_y$, while p decreases monotonically from 400 Oe. Also shown in FIG. 3c is $\Delta f_{pred}$, as determined from Eq. 1 and Eq. 3 using the estimated p and the measured I ∂f/∂I. The data shows that there is quite good agreement between experiment and prediction from 675 Oe to 800 Oe.

The quasi-linear (|v|≤1) STNO behavior that is obtained over a rather broad range of field and current in the optimum field bias regime as illustrated by the inset of FIG. 3d, is caused by a combination of a reduced agility, |N'|=∂f/∂p|≤4 GHz, with a high effective damping $\Gamma_{eff}' \sim 2$-6 GHz. The lower N' arises from the fact that for an in-plane magnetized FL with a significant $H_k$ such that 145°>$\phi_o$>90° the strong red shift with oscillator power due to the out-of-plane demagnetization field can be substantially balanced by a blue shift resulting from $H_k$. FIG. 2d shows measurements of $N_{meas}'$ as obtained experimentally for our device at I=−4 mA along with the prediction from a macrospin modeling (& simulation) of the LLGS equation for $N_{macro}'$ at the onset of oscillation for $H_k$=450 Oe and two different values of $H_d$ (100 and 250 Oe). The lower $H_d$ provides the somewhat better match to the data despite being well below the experimentally determined $H_d$=250 Oe. In general macrospin modeling does not provide a good quantitative description of $N_{meas}'$ because of the significant spatial variations in the magnetization orientation across the FL (see below). Notably k, $N_{meas}'$ ranges between ±4 GHz for 700 Oe<$H_y$<900 Oe, yet in general |v|≤1 in this field range (see FIG. 3d inset). This is the result of the high effective damping $\Gamma_{eff}=(2\pi)^{-1}\partial\Gamma(p,I)/\partial_p=(\Gamma_0/2R\pi I)(\partial p/\partial I)^{-1}$ of our STNO device in this field range that arises from its non-uniform magnetic configuration.

Figure 4:
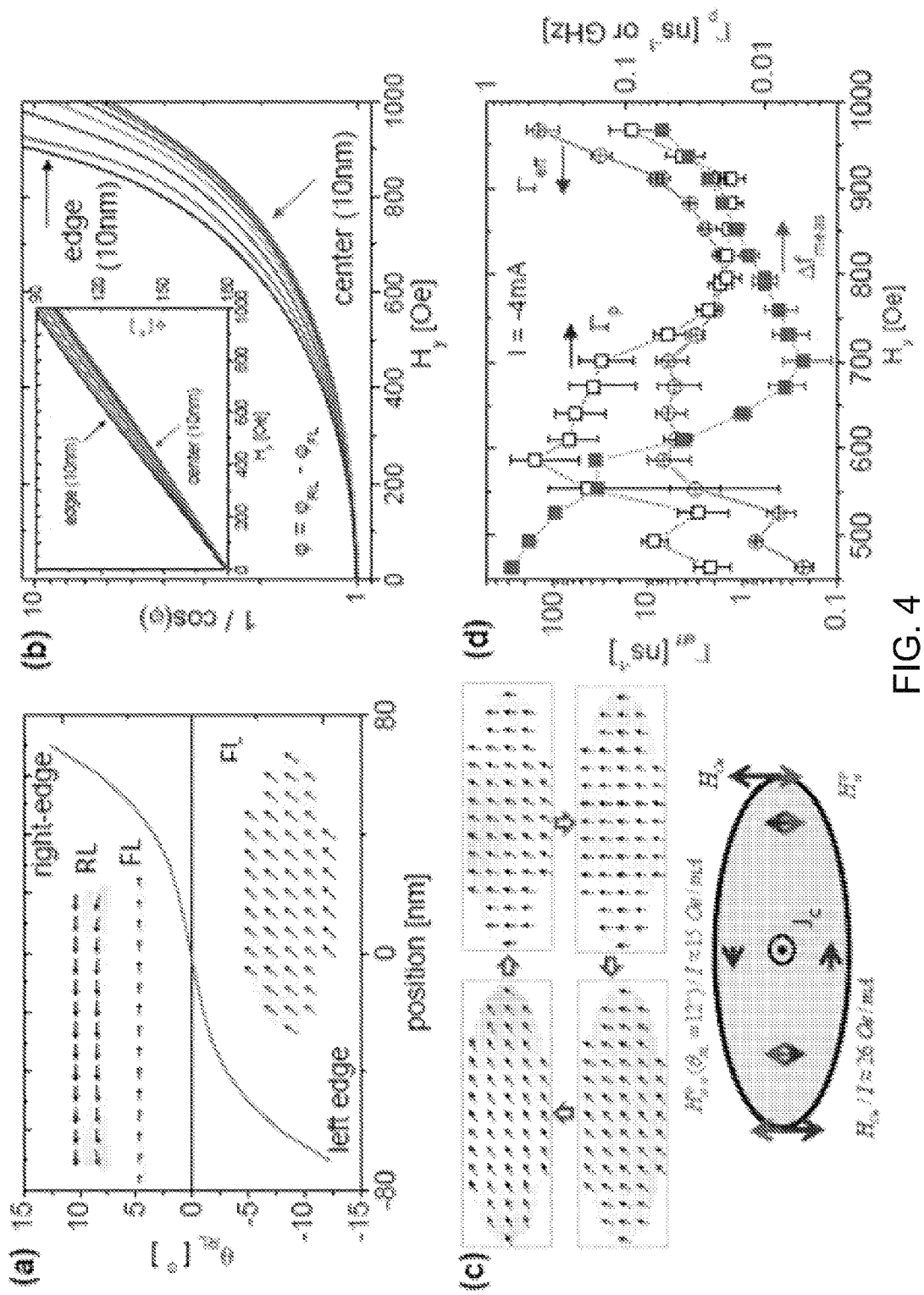
FIG. 4 includes FIGS. 4a, 4b, 4c and 4d showing sample measurements in the same sample STNO device in FIG. 2. (a) The out-of-plane orientation ($\theta_{RL}$) of the RL magnetization as the function of position along its elongated (easy) axis, as determined by micromagnetic calculations for $H_y$=800 Oe. Insets: the micromagnetic configuration of the STNO (top view of the FL and side view), for $H_y$=800 Oe. (b) Variation of 1/cos ($\phi$) (~$J_c$) along the easy axis of the FL where $\phi$ is the in-plane offset angle between the FL and RL magnetization as determined by micromagnetics calculations. (c) (top) Micromagnetic simulations of the FL magnetization at four times during one ST oscillation. The color scale indicates the strength of the out-of-plane magnetization component; (bottom) Schematic showing the partial counter balancing at the ends of the FL of the calculated Oersted field generated by the current bias and the effective in-plane spin torque field generated by the out-of-plane polarized incident spin current. (d) Effective damping parameter $\Gamma_{eff}'$ of the STNO as determined from the experimental data using Eq. 3 as the function of $H_y$, for I=−4 mA. Also shown are $\Gamma_p'$ and $\Delta f_{meas}$ for comparison.

The inset of FIG. 4a shows the result of T=0 micromagnetic modeling of the (idealized) device structure for the case of $H_y$=800 Oe, for I=0. There is significant variation $\delta\phi_o \approx 10°$ in the in-plane orientation of the magnetization across the FL relative to that of the RL (see inset of FIG. 4b), which results in approximately a factor of two variation in the spin torque efficiency and hence the critical current density $J_c$ for the onset of ST oscillation between the FL ends and center for $H_y$>700 Oe (see FIG. 4b). Because of this spatial variation, as $H_y$ is increased it requires lower values of oscillation amplitude to rotate the magnetization of the end regions to an orientation $\phi_o \leq 90°$ relative to that of the RL, at which point the ST at the ends begins to act to damp the oscillation while it continues to provide anti-damping excitation to the middle region. The result, as indicated by snap-shots of the FL at various points during one period of oscillation (FIG. 4c and FIG. 7), is that at sufficiently high I, the end regions rotate to or slightly past $\phi_o \sim 90°$ and then stop while the middle regions continue to rotate towards the same orientation. For the opposite part of the oscillation cycle the center is first to begin to back move towards the easy axis orientation while the ends lag. This "pinning" and "lagging" of the end regions, which becomes stronger for increasing $H_y$, provides the greatly enhanced dynamic damping (I∂p/I→0) that, together with the reduced agility (~low N'), lowers or eliminates the non-linearity of the system.

There is an additional feature of this particular STNO structure that further aids in the achievement of highly coherent quasi-uniform oscillations. This is the significant out-of-plane magnetization component at the bottom of the RL which results in the spin current incident on the FL having an orthogonal, out-of-plane component that exerts an effective magnetic field, $$\vec{H}_{ST}^{ip} \sim \vec{n} \times \vec{p} \sin(\theta_{RL})$$

in the end regions, where $\vec{p}$ is the spin-polarization of the RL and $\theta_{RL}$ is the out-of-plane angle of that polarization (see FIG. 4a). This $\vec{H}_{ST}^{ip}$ acts to rotate the in-plane FL magnetization in a clock-wise manner, opposite to the counter-clock rotation that the Oersted field ($H_{Oe}$) from the bias current promotes (see FIG. 4c). The substantial balancing of the non-uniform $H_{Oe}$ by $H_{ST}^{ip}$ results in more symmetric behavior at the two ends of the FL and in quasi-uniform oscillations despite the spatially varying ST and non-uniform fields.

FIG. 4d shows a plot of experimental $\Gamma_{eff}'$ ($H_y$) for $I_{dc}$=−4 mA, using Eq. 3. For 600 Oe≤$H_y$≤750 Oe, $I_{dc}$=−4 mA places the STNO in the quasi-saturated power regime and we have $\Gamma_{eff}' \approx 3$-6 ns$^{-1}$, much higher than $\Gamma_0/2\pi \approx 0.1$ ns$^{-1}$. For 750 Oe≤$H_y$≤850 Oe $p_n$ is in the regime where for $I_{dc}$=−4 mA it varies quasi-linearly with I and ∂p/∂I is approximately constant yielding $\Gamma_{eff}' \approx 2$-3 ns$^{-1}$, but now the small agility N' due to the close balance of the red and blue shift effects (FIG. 3d) again result in a small non-linearity (v). For $H_y$>850 Oe, $\Gamma_{eff}'$ grows even larger as ∂p/∂I decreases rapidly due to the rapidly diminishing ST efficiency and enhanced damping of the left end region of the FL, as discussed above.

FIG. 4d also shows the power restoration rate $\Gamma_p'=p\Gamma_{eff}'$ that characterizes the dynamic damping of a STNO. For 600 Oe<$H_y$<850 Oe, $\Gamma_p'$ ranges from 0.3 ns$^{-1}$ to 0.02 ns$^{-1}$. This rapid relaxation of power fluctuations is the result of the very strong $\Gamma_{eff}'$ in our device configuration despite its relatively low power p. Above 900 Oe, $\Gamma_p'$ increases still further despite the rapid decrease in p due to the very strong enhancement in $\Gamma_{eff}'$ (∂p/∂I→0) as $\phi_o$ approaches 90°, indicating that here deviations in oscillator amplitude very quickly stabilize to the mean precession orbit, as previously implied with micromagnetic simulations. We also plot the oscillator linewidth $\Delta f_{meas}$ in FIG. 4d for comparison to $\Gamma_p'$. Note that above 850 Oe the two are comparable which explains why in this field regime $\Delta f_{meas}$, while increasing rapidly due to the decreasing p, becomes progressively less than predicted by the nonlinear theory (see FIG. 3c) since the derivation of the renormalization factor $(1+v^2)$ requires $\Delta f \ll \Gamma_p'$.

These results demonstrate that spin currents if applied in an effective non-uniform manner can be utilized not only to excite magnetic oscillations by an anti-damping effect, but also to provide a non-linear effective damping that restricts power excursions and thus reduce if not fully eliminate the non-linear coupling between amplitude and phase fluctuations that limit the phase stability of conventional STNOs with uniform excitation currents. The STNO is still frequency agile to a useful degree since the ST results in a moderate $I\partial f/\partial I$ ($\gg \Delta f$) even where $|v| \leq 1$. In the implementation of this basic approach discussed here the maximum normalized power is relatively low, $p \leq 0.03$, in the quasi-linear regime. This helps ensure that the oscillating FL does not have sufficient energy to break up into multiple modes in the presence of the spatially non-uniform anti-damping and damping spin torques, but it also limits the minimum attainable linewidth, $\Delta f \propto 1/p$. Refinements to the design can be made to provide a quasi-linear STNO that can reach higher normalized power levels, $p>0.1$, before being saturated by the non-linear damping, room temperature nanoscale oscillators with linewidths <1 MHz should be possible. This would be a considerable advance in the development of STNO's, particularly if achieved in a higher impedance device that operates successfully without the requirement of an externally applied magnetic field.

Our tested sample STNO was fabricated from a thin film multilayer stack of Py(5)/Cu(120)/Py(5)/Cu(12)/Py(20)/Cu(2)/Pt(30) (thickness in nm) deposited on an oxidized Si substrate, where Py=Ni$_{80}$Fe$_{20}$. The device had an elliptical cross-sectional area of ~50×145 nm$^2$ at the bottom of the nanopillar, as measured by scanning electron microscopy (±5 nm). In this structure the thinner FL is located closer to the substrate than the thicker ferromagnetic reference layer (RL) and hence the latter has a higher aspect ratio than the former due to the sidewall tapering (20°-30°) during the ion-mill process. Therefore the shape anisotropy field ($H_k$) of the RL is much higher than for the FL, which fairly strongly fixes the unpinned RL, with a measured coercivity $H_c$(RL)≈1300 Oe, over the $H_y$ range employed in the experiments, while $H_c$(FL)≈170 Oe.

The micromagnetic simulations incorporate the LLGS equation appropriate for a spin valve structure at T=0 with the exchange constant A=13×10$^{-12}$ J/m, saturation magnetization $M_s$=560 emu/cm$^3$, Gilbert damping parameter of 0.01, spin polarization P=0.37 and the volume discretized into 2.5 nm cubes for computational purposes. Static (I=0) simulations of a spin valve structure are used to determine the initial micromagnetic state of the free and reference layers at the desired hard axis magnetic field. Dynamic (I≠0) simulations include effects from magnetic interactions between the two layers and the Oersted field due to I. Spin torque is exerted upon both layers, with the local spin polarization of the current incident upon a layer being dependent on the local magnetization vector of the second ferromagnet, i.e. the current flow was assumed to be one-dimensional. Simulations were conducted by treating spins classically and using the assumption that spins transmit the parallel component and reflect the antiparallel component of the local magnetization perfectly, depending on the direction the electrons traverse.

The derivation of nonlinear effective damping ($\Gamma_{eff}'$) of a STNO in the simulations is as follows. The Landau-Lifshitz-Gilbert Slonczewski (LLGS) equation is used to derive the non-nonlinear auto-oscillation model for a single mode STNO:

$$\frac{\partial a}{\partial t} + i\omega(p)a + [\Gamma_+(p) - \Gamma_-(I,p)]a = f_n(t).$$

(S1) where $\omega(p)=\omega_0(1+\xi(p))$ is the power-dependent oscillation frequency, $\Gamma_+(p)=\Gamma_o(1+\eta(p))$ is the dissipative positive damping, and $\Gamma_-(I,p)$ is the negative damping from the spin-transfer-torque, which can be generally expressed as $\Gamma_-(I,p)=\sigma_o I g(p)$ where $g(p=0)=1$ at $I=I_c$ ($=\Gamma_o/\sigma_o$). For a stationary (steady-state) auto-oscillation the total, time-averaged damping is zero, or $$\Gamma(I,p)|_{p=p_o} \equiv [\Gamma_+(p) - \Gamma_-(I,p)]|_{p=p_o} = 0 = [\Gamma_o(1+\eta(p)) - \sigma_o I g(p)]|_{p=p_o} \quad (S2)$$

In the case of a collinear STNO oscillator $g(p)=1-p$, the corrections due to spin accumulation effects in a spin valve device are ignored in the simulations. For a non-collinear device $g(p)$ can be a much weaker and slower function of p. Eq. S2 can be used to derive the following, $$\frac{1+\eta(p)}{I} = \frac{g(p)}{I_c}, \quad \frac{\partial \Gamma(I,p)}{\partial I} = -\Gamma_o \frac{g(p)}{I_c}$$

(S3) Since $$d\Gamma(I,p) = \frac{\partial \Gamma}{\partial I} dI + \frac{\partial \Gamma}{\partial p} dp = 0$$

and using Eq. S3, the following equations can be obtained:

$$\Gamma_{eff}' \equiv \frac{1}{2\pi}\frac{\partial \Gamma}{\partial p} =$$

$$-\frac{1}{2\pi}\frac{\partial \Gamma}{\partial I}\frac{\partial I}{\partial p} = \frac{\Gamma_o}{2\pi}\frac{g(p)}{I_c}\left(\frac{\partial p}{\partial I}\right)^{-1} = \frac{\Gamma_o}{2\pi}\frac{1+\eta(p)}{I}\left(\frac{\partial p}{\partial I}\right)^{-1}$$

$$v \equiv \frac{N'}{\Gamma_{eff}'} = \frac{\frac{\partial f}{\partial p}}{\frac{\Gamma_o}{2\pi}\frac{1+\eta(p)}{I}\left(\frac{\partial p}{\partial I}\right)^{-1}} = \frac{2\pi}{\Gamma_o}\frac{I}{1+\eta(p)}\left(\frac{\partial f}{\partial I}\right) \quad (S4)$$

(S5) In various circumstances, $\eta(p)$ is negligible in a collinear spin valve STNO. This condition and the assumption of the low normalized power levels in the single mode regime yield the following:

$$\Gamma_{eff}' = \frac{\Gamma_o}{2\pi I}\left(\frac{\partial p}{\partial I}\right)^{-1}, \text{ and } v = \frac{2\pi I}{\Gamma_o}\left(\frac{\partial f}{\partial I}\right). \quad (S6)$$

Micromagnetic calculations were used in our simulations to compute by the energy minimization method the internal field distribution ($\vec{H}_{int}(\vec{r})$) for our STNO device under an external field $H_y$. The modeled multilayer structure had a tapered elliptical shape with a sidewall taper of 20° and with cross-sectional dimensions of 50×150 nm$^2$ at the bottom of the nanopillar stack. The modeling digitized the volume into 2.5×2.5×2.5 nm$^3$ unit cells. Starting from the bottom the multilayer consisted of Py(5)/Cu(12.5)/Py(20), with the thickness in nm. An exchange parameter $A=13\times10^{-12}$ J/m was assumed for Py ($Ni_{80}Fe_{20}$), and the other material parameters employed in the modeling have been provided in the main text. The contributors to $\vec{H}_{int}(\vec{r})$ were $\vec{H}_y$, the dipolar field ($\vec{H}_d(\vec{r})$) from the RL and the demagnetization field ($\vec{H}_{demag}(\vec{r})$) of the FL itself. The internal field determines the "natural" oscillation frequency of each element of the FL at the onset of oscillation, and hence, given the limited strength of the exchange coupling between the elements, the width and character of this distribution provides a measure of the tendency of the FL to have multiple, spatially distributed, modes of oscillation as opposed to exhibiting a single, more or less spatially uniform oscillation when the distribution is sufficiently narrow.

Figure 5:
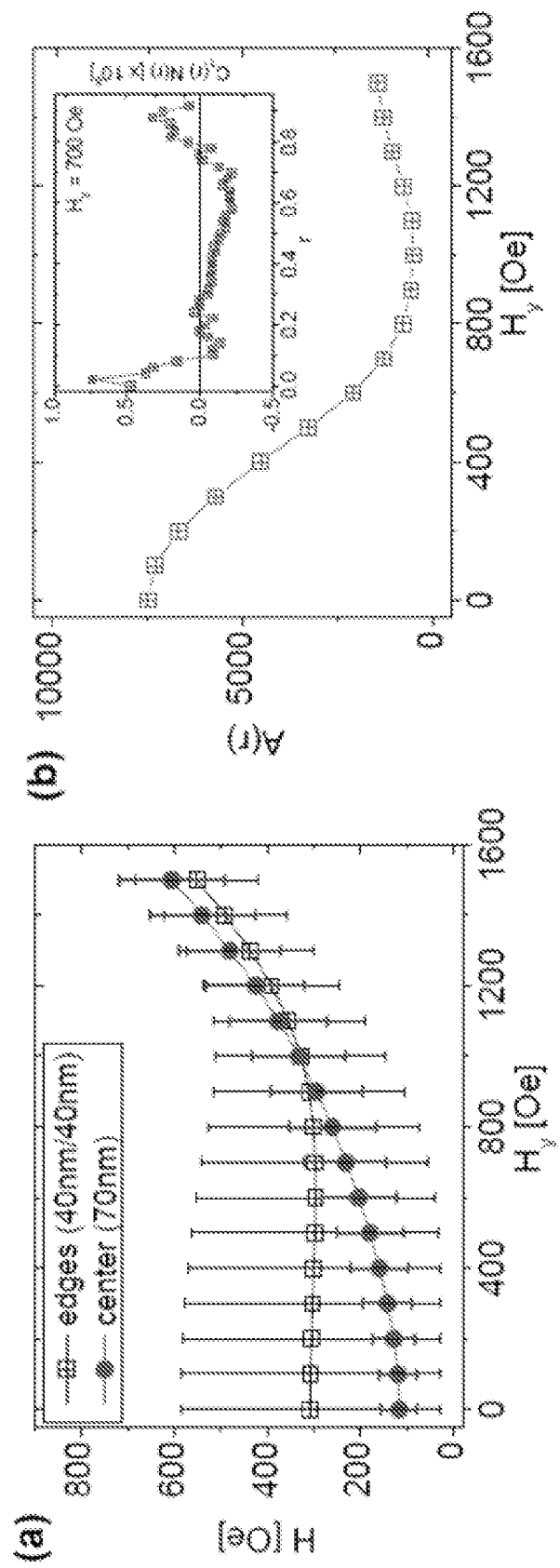
FIGS. 5, 6, 7 and 8 show various simulations of our sample STNO device.

In general $\vec{H}_{int}(\vec{r})$ of the FL of a spin valve nanopillar has a spatial non-uniformity, with both its local average and dispersion being strongly dependent on the location and $H_y$. To quantify the topographical inhomogeneity of $\vec{H}_{int}(\vec{r})$ in our structure we employed two different methods. The first was to compare the local average and dispersion of $|\vec{H}_{int}(\vec{r})|$ in three different regions of the FL defined as the regions encompassed by the left 40 nm of the long axis of the ellipse, the center 70 nm and the right 40 nm. FIG. 5a shows that there is a significant difference in the averages of $|\vec{H}_{int}(\vec{r})|$ between the edges and the center region at low $H_y$, but as $H_y$ increases to ≈700-800 Oe this difference reduces substantially, indicating a convergence in the average, natural oscillation frequency in the different regions of the FL.

The second method used to characterize the internal field distribution was to calculate the correlation function $A(H_y)=\sqrt{\int dr |C(r)|}/\int dr N(r)$ where $C(r)=\iint_{|r'-r''|=r} dr'' dr' (\vec{H}(\vec{r}')-\bar{H})(\vec{H}(\vec{r}'')-\bar{H})$ is th auto-correlation function of the internal field distribution and $N(r)=\iint_{|r'-r''|=r} dr'' dr'$ is the normalization function. $A(H_y)$ provides a quantitative, weighted measure of the spatial non-uniformity in $\vec{H}_{int}(\vec{r})$ as the function of the hard axis bias. As shown in FIG. 5b, $A(H_y)$ decreases markedly, by more than a factor of six as $H_y$ is increased to ~700 Oe, and reaches its minimum value at ≈1000 Oe. Thus both approaches indicate that the internal field distribution is much more uniform when $H_y$ is in the 700 to 1000 Oe than at lower bias fields, consistent with view that a relatively uniform internal field distribution will result in single mode behavior in a STNO.

The estimation of the STNO normalized oscillator power p and nonlinear coupling v is provided below. The appropriate parameters ($\alpha_G=0.01$, $M_s=560$ emu/cm$^3$) for the Py free layer can be applied to Eq. 1 to estimate that $\Delta f_{pred} \approx [0.7(1+v^2)/fp]$ MHz at T=300 K, where f is the oscillator frequency in GHz. To compare the measured linewidth $\Delta f_{exp}$ with $\Delta f_{pred}$ we obtained appropriate values for p under various field and current biases from the measured power (P), delivered to the 50Ω ($R_L$) transmission line, that is $P=(\Delta V)^2 R_L/2(R_L+R_S)^2$ where $R_S$ is the device resistance ($R_S\approx25\Omega$). In converting P to p, we assumed that the magnetoresistance voltage signal is $\Delta V(t) \approx I \cdot (\partial R/\partial \phi|_{\phi_o}) \cdot \sin(\omega t) \cdot \epsilon$ (as appropriate for the case $\phi_o \leq 135°$), where $R(\phi(t))=(\Delta R_o/2)[1-\cos\phi(t)]/[1+(\chi/2)(1+\cos\phi(t))]$ and $\phi(t)=\phi_o+\epsilon\sin(\omega t)$. We measured $\Delta R_o=0.2\Omega$ and assumed $\chi=1$ as previously reported for Py.

As an example, we obtained P≈90 pW at $H_y^{opt}=700$ Oe and $I^{opt}=-4$ mA. From the measured onset current of ~−1.25 mA for $H_y=700$ Oe, we estimated $\phi_o\approx124°$ (see FIG. 3a), and thus obtained $\epsilon\approx18.3°$. The macrospin modeling indicates that the orientation of the precession axis $\phi_o$ shifts with bias current (oscillation power) in this field regime due to the non-parabolic nature of the magnetic energy potential, and thus $\phi_{o,-4mA}$ could be as low as ~116° which would result in a negligible difference ($\epsilon\approx18.4°$). If it is assumed p=$\sin^2(\epsilon/2)$, although this is also not strictly correct due to the energy potential, we have p≈0.025. At I=−4.0 mA we measured $\partial f/\partial I \approx -16$ MHz/mA, which yields v≈−0.65 and thus $\Delta f_{pred}\approx6.6\pm1.3$ MHz, quite close to $\Delta f_{exp}\approx5\pm2$ MHz.

The following describes the effect of spin-polarization direction on the critical current ($I_c$) and p in the macrospin approximation. Our sample STNO exhibits a low non-linearity v (=N'/$\Gamma_{eff}$') in large part due to a strong enhancement of $\Gamma_{eff}$', or equivalently a substantial reduction of ST efficiency ($\propto I \partial p/\partial I$). This is the result of a significant spatial variation in the orientations of the magnetization of both the FL and the RL in the field bias regime where a coherent single mode oscillation is obtained. To gain insight into how different orientations of the FL magnetization and of the incident spin polarization, which is determined by the local RL magnetization, affect the local spin torque efficiency we have performed zero temperature (T=0) macrospin modeling for different rigid domain orientations, in addition to the micromagnetic simulations. The macrospin modeling utilized the LLGS equation:

$$\frac{dm}{dt}=-\gamma m \times \vec{H}_{eff}+\alpha_G m \times \frac{dm}{dt}+\gamma a_J(\theta)m \times p \times m \quad (S7)$$

where $a_J(\theta)=\frac{\hbar}{2e}\frac{I}{M_s V}Pg(\theta)$ and $\vec{H}_{eff}=(H_k m_x+H_d)\hat{x}+H_y\hat{y}-4\pi M_s m_z \hat{z}$.

Here $\gamma$ is the gyromagnetic ratio, m=($m_x,m_y,m_z$) is the unit vector of the FL, $H_k$ is the anisotropy field of the FL along the easy axis, $H_d$ is the dipole field from the RL, $H_y$ is the externally applied hard axis magnetic field, g($\theta$)=½, and the spin-polarization P=0.37. With Eq. S7 we obtained m(t) and from this time dependence of the rigid FL moment we determined its precessional axis ($\phi_{FL}$ and $\theta_{FL}$) and p=$\sin^2(\epsilon/2)$ as the function of I, $H_y$, and $H_d$ for $H_k$=450 Oe, where $\phi_{FL}$ is the in-plane orientation of the FL as measured from $-\hat{x}$, $\theta_{FL}$ is its out-of-plane tilt angle and e is the maximum in-plane precessional excursion angle (see FIG. 6a). The simulations were run for different out-of-plane orientations of the incident spin polarized current $\hat{p}$. The current for the onset of oscillation ($I_c$) was extracted from p(I) for each set of field values ($H_d$ and $H_y$) (e.g. see FIG. 7b for the case $H_d$=100 Oe, and p=(−1,0,0)).

In a strongly non-collinear configuration such as our STNO, $\tau_{st}$ has two significant components; the anti-damping effect from $\vec{p}$ and a magnetic field effect from $\vec{p}_\perp$, where $\vec{p}_\perp(\vec{p}_\parallel)$ is the orthogonal (parallel) component of $\vec{p}$ to m (i.e. $\vec{p}=\vec{p}_\parallel+\vec{p}_\perp$). The anti-damping spin torque $\tau_{st}(\vec{p}_\parallel)$~m×p×m counters the damping torque $\tau_d$ to excite the FL oscillations once the onset current $I_c$ is reached. Since $\tau_{st}$: cos $\phi_{FL}$ this results in $I_c=I_{C0}/|\cos\phi_{FL}|$ as employed in FIG. 3a and as illustrated in FIG. 6b an increasing $I_c$ with increasing $H_y$.

Figure 6:
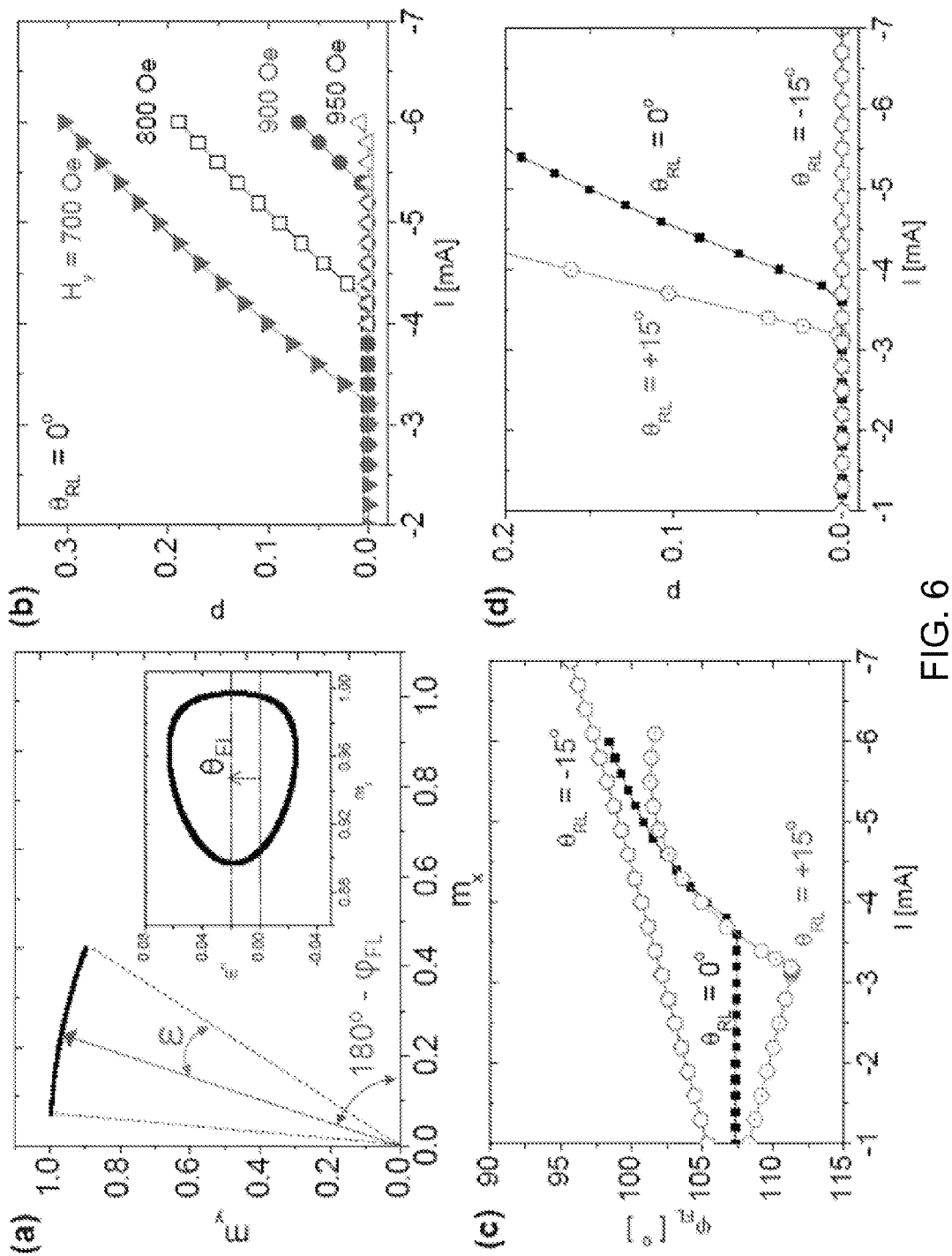

The spin torque effective field $\vec{H}_{st}$~m×$p_\perp$ becomes an important factor when the incident spin current has a substantial out-of-plane polarization component, p=(−cos $\theta_{RL}$, 0, sin $\theta_{RL}$). In that case there can be a significant in-plane $\overset{\omega_{ip}}{H_{SI}}$ that alters $\phi_{FL}$, in a manner dependent on the sign of $\theta_{RL}$. For $\overset{\omega_{ip}}{H_{SI}}$ acts to decrease $\phi_{FL}$ (rotate the FL moment towards the hard axis). Thus a $-\hat{z}$ out-of-plane spin polarization acts to increase the onset current $I_c$ and, if sufficiently strong can completely suppress the onset of ST oscillation as in the $-15°$ case illustrated in FIGS. 6c and d. For a $+\hat{z}$ out-of-plane spin current polarization component the resultant $\overset{\omega_{ip}}{H_{SI}}$ acts to rotate the FL towards its easy axis, decreasing $I_c$ $(+\theta_{RL})$ below the $I_c$ $(\theta_{RL}=0°)$ case, as also illustrated in FIG. 6. Note that in this non-collinear configuration above the onset of oscillation $\phi_{FL}$ in general increases as the precession axis changes due to the non-parabolic nature of the energy potential in this non-collinear configuration, but with that change modified by the effect of $\overset{\omega_{ip}}{H_{SI}}$.

To obtain a quasi-linear STNO it is necessary that its agility be no more than comparable to the effective damping of the oscillator $\Gamma_{eff}$'; in our case $|N'|=\partial f/\partial p|\le 4$ GHz. This is achieved by magnetic biasing the oscillator, by some combination of external and internal effective fields, such that the red and blue frequency shifts as the function of oscillator amplitude that arise from anisotropy field effects are approximately balanced. For an in-plane magnetized spin valve or magnetic tunnel junction STNO the suggested approach is to apply an external field with a substantial hard axis component so that the red shift due to the power dependence of the oscillation frequency from the out-of-plane demagnetization field is balanced by the blue shift arising from the in-plane anisotropy field. Analysis treating the FL as a rigid domain, or alternatively macrospin modeling, can provide understanding of the origin of the reduced agility, and some general guidance as to what field configuration to employ to achieve it.

Within the macrospin approximation the magnetic energy of the FL under the assumption that the RL does not rotate at all with $H_y$, is given by $E(\phi,\theta)=-H_xM_s \cos\theta \cos\phi - H_yM_s \cos\theta \sin\phi - (H_kM_s/2)\cos^2\theta \cos^2\phi + 2\pi M_s^2 \sin^2\theta$ where $\theta$ is the out-of-plane tilt angle of the FL moment. At equilibrium $(\vec{m}//\vec{H})$ the FL lies in-plane and we have: $(H_k-H)\cos\phi_o=H$ and $H \sin\phi_o=H_y$,
(S8), where H is the effective in-plane internal field. The ferromagnetic resonance frequency of the FL is then $\omega_o^2 \approx \gamma^2[H-H_k \sin^2\phi_o][H+4\pi M_s \cos^2\theta]_{\theta=0°}$
(S9), and thus $\omega_o$ is determined by the effective in-plane anisotropy field $(H_{k,eff}=H_k \sin^2\phi)$ and the out-of-plane demagnetization field $(4\pi M_{eff}=4\pi M_s \cos^2\theta)$. When the FL is ST excited, the mean oscillation frequency varies with amplitude. To examine this we assume a (small angle) in-plane precession of the FL about H $(\phi=\phi_o+\epsilon \sin(\omega t))$, although we note that the $\tau_{st}$ also shifts the oscillation's in-plane $(\phi_o)$. We then have $<H_k \sin^2\phi>\approx H_k(\sin^2\phi_o+\cos 2\phi_o\cdot 4p)$ and $4\pi M_{eff}<4\pi M_s\cdot\xi\cdot\cos^2(\epsilon)>\approx 4\pi M_s(1-\xi\cdot 4p)$ where $p\equiv<\sin^2(\epsilon/2)>\approx<\epsilon^2>/4$ and $\xi$ is the ellipticity factor due to $4\pi M_{eff}>>H$. The time-averaged $\omega^2$ is $\omega^2 \approx \gamma^2 [H-H_k(\sin^2\phi_o+\cos 2\phi_o \cdot 4p)][H+4\pi M_s(1-\xi\cdot 4p)]$ and we have:

$$N' \equiv \frac{\partial f}{\partial p} \approx -\frac{\gamma^2}{\pi\omega}[(H_k \cos 2\phi_o)(H+4\pi M_s(1-4\xi p)) + 4\pi M_s \xi(H-H_k(\sin^2\phi_o + \cos 2\phi_o \cdot 4p))]. \quad (S10)$$

FIG. 7a shows contour map of N' calculated via Eq. S10 as the function of $H_d$ and $H_y$ for $H_k=450$ Oe, p=0.03, and for an idealized simple elliptical orbit where $\xi \approx (H-H_k \sin^2\phi_o)/4\pi M_s$ due to the energy balance between the maximum out-of-plane and in-plane excursions. For the case of $H_d=250$ Oe this result predicts a transition from a red shift, N'<0, to a blue shift, N'>0, at $H_y \approx 600$ Oe (FIG. 5b), which is somewhat below the experimentally observed transition point, $H_y \approx 750$ Oe, that depends weakly on $I_{dc}$ (FIG. 3d). FIG. 7b also shows the result for the elliptical case, and also, for comparisons, the $\xi=1$ case (circular precession), the $\xi=0.32$ case (arbitrary but close to the experimental observation), and the result of a previous somewhat different analysis, all for the case of $H_k=450$ Oe, $H_d=250$ Oe.

The macrospin simulations were used to estimate N', utilizing Eq. S7. The result for the case of $H_k=450$ Oe, $H_d=100$ Oe and 250 Oe is also shown in FIG. 3d. That result lies between the prediction of the analytical approximation that assumes a pure elliptical orbit and those that assume a circular orbit. This is due to the fact that the non-conservative, $\phi$-dependent ST affects the time-averaged dynamic energy balance of the precessional orbit and somewhat reduces its ellipticity, but does not result in circular precession. This point in illustrated by the insert in FIG. 7a that compares the small amplitude precession orbit as determined by full macrospin modeling with the elliptical orbit expected from a simple in-plane and out-of-plane energy balance.

Figure 7:
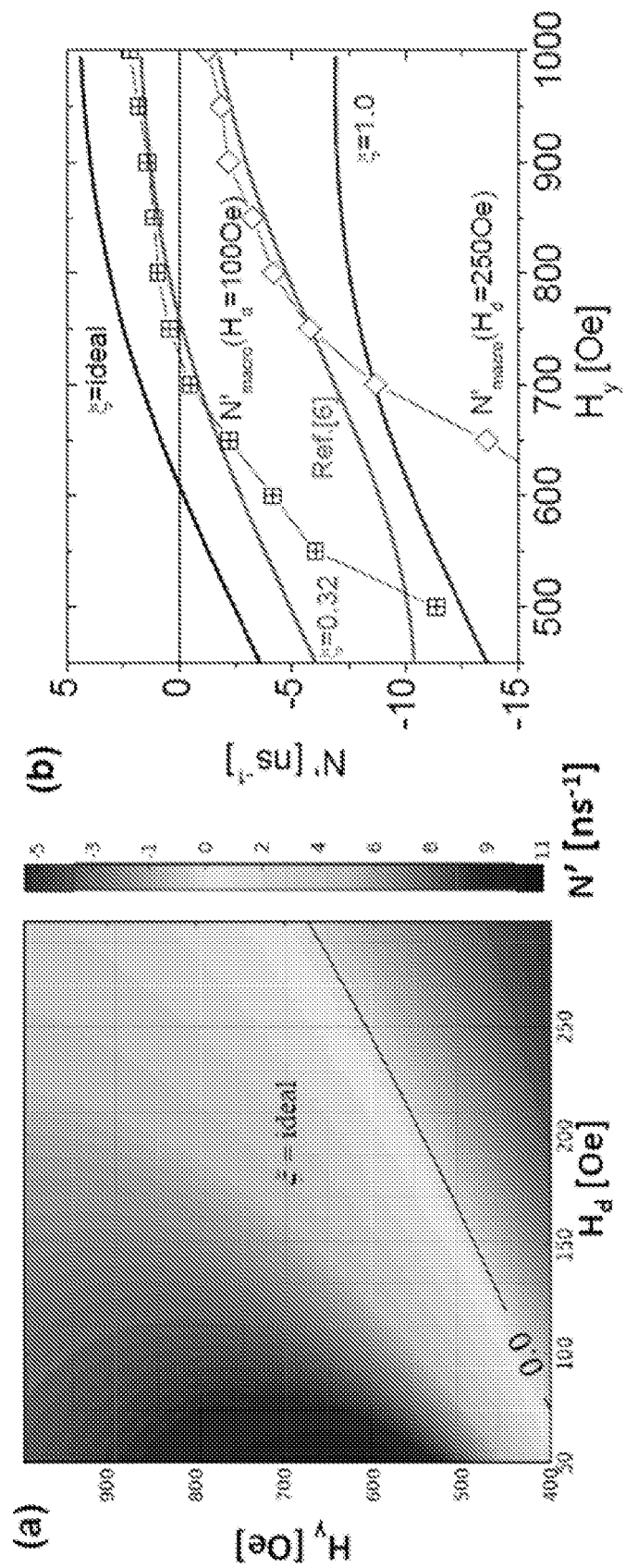

FIG. 3d and FIG. 7 show that while the macrospin approximation provides a general understanding of the cross-over between red shift and blue shift behavior as $H_y$ is increased, even full macrospin modeling gives only an approximate indication of the variation of the agility as the function of applied fields in the non-collinear case. This is attributable to the non-uniform nature of the magnetization of the FL in this field regime that requires micromagnetics to fully model and, if desired, to provide more precise guidance as the field bias that will minimize N'.

To gain further understanding of the origins of the enhanced dynamic effective damping and the coherent oscillations in this STNO design, zero T micromagnetic simulations were performed for the idealized elliptical STNO utilizing Eq. S7. The simulations include the non-uniform circumferential Oersted field (H) generated by the bias current. In general for hard axis biases $H_y=700$-1000 Oe, and for current biases from $-3$ mA to $-5$ mA, we consistently obtained quite coherent oscillations of the FL for $H_y=800$ Oe, $I=-3$ mA and Mov.S2 for $H_y=800$ Oe, $I=-4$ mA. The precession amplitude $\epsilon \sim 20°$ is rather close to the estimate obtained from the experimental results. While coherent the oscillations are not uniform. This is seen by looking at snap-shots of the FL and RL magnetization during one oscillation cycle, FIG. 8, for the case of $H_y=800$ Oe and $I=-4$ mA. There are differences between the behavior of the FL center area and its end regions and this is in part due to the variation across the FL of the offset angle $\phi$ of the FL magnetization relative to that of the RL above it. In the absence of a ST bias the two FL regions are rotated closer to the hard axis than the center region, which increases the critical current density for ST oscillation onset in the end regions. When the ST is applied the end regions remain more rotated towards the hard axis than the center at the "easy axis" extrema of the oscillation (first panel). As the oscillation proceeds towards the hard axis direction (second panel) the magnetization of the end regions reaches the hard axis direction before the center region. At that point $\phi \le 90°$ and the spin torque retards further rotation of the FL magnetization in the end regions while the center region continues to rotate toward the hard axis (panel 2). At this bias level the hard axis extrema of the oscillation occurs when the FL is more or less uniform in the hard axis direction (panel 3). The FL magnetization then moves away from this point in a non-uniform manner with the center region leading and the end regions lagging (panel 4). The simulations also indicate that there is a smaller ST oscillation in the magnetization of the bottom of the RL which is largely concentrated in the end regions and which acts to enhance the ST damping of the FL end regions.

Figure 8:
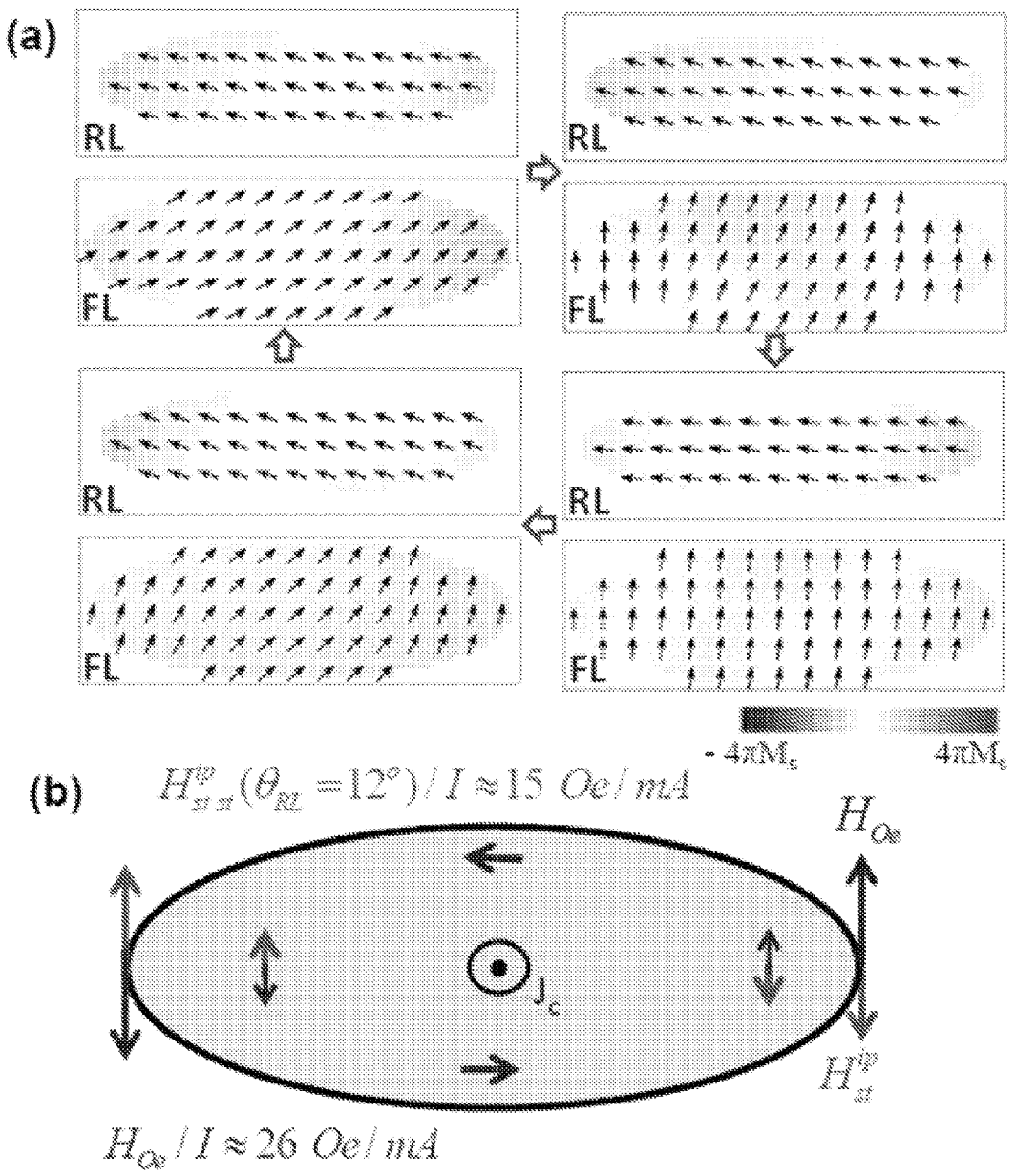

The micromagnetic simulations also serve to demonstrate the beneficial effect of the out-of-plane magnetization in the end regions the RL in promoting a more coherent mode of FL oscillation particularly at the higher bias currents. As discussed in the main text the in-plane effective ST field $\vec{H}_{ST}^{ip}$ that arises from the perpendicular spin current component acts to counter-balance the circumferential Oersted field generated by the bias current in the end regions as illustrated in FIG. 8. On the FL along the easy axis, $H_{ST}^{ip}$ is clockwise, opposite to $H_{Oe}$ and the estimated $H_{Oe} \approx 26$ Oe/mA for I=−4 mA is partially cancelled by $H_{ST}^{ip} \approx 15$ Oe/mA assuming $\theta_{RL} \approx 12°$ as determined by averaging the modeled RL magnetization over several end region cells. We established the importance of this counterbalancing by carrying out simulations where the Oersted field was not included. This resulted in the oscillation becoming much less coherent at high current biases due to the substantially different effective fields at the two ends of the FL. Since $H_{ST}^{ip}$ depends on the local out-of-plane orientation of the RL magnetization $\theta_{RL}$, the current polarization P, and the angular dependence of the spin torque function $g(\phi)$ an even closer balance of the Oersted and ST fields might be achievable with careful tuning of the device geometry (taper) and choice of material.

Figure 9:
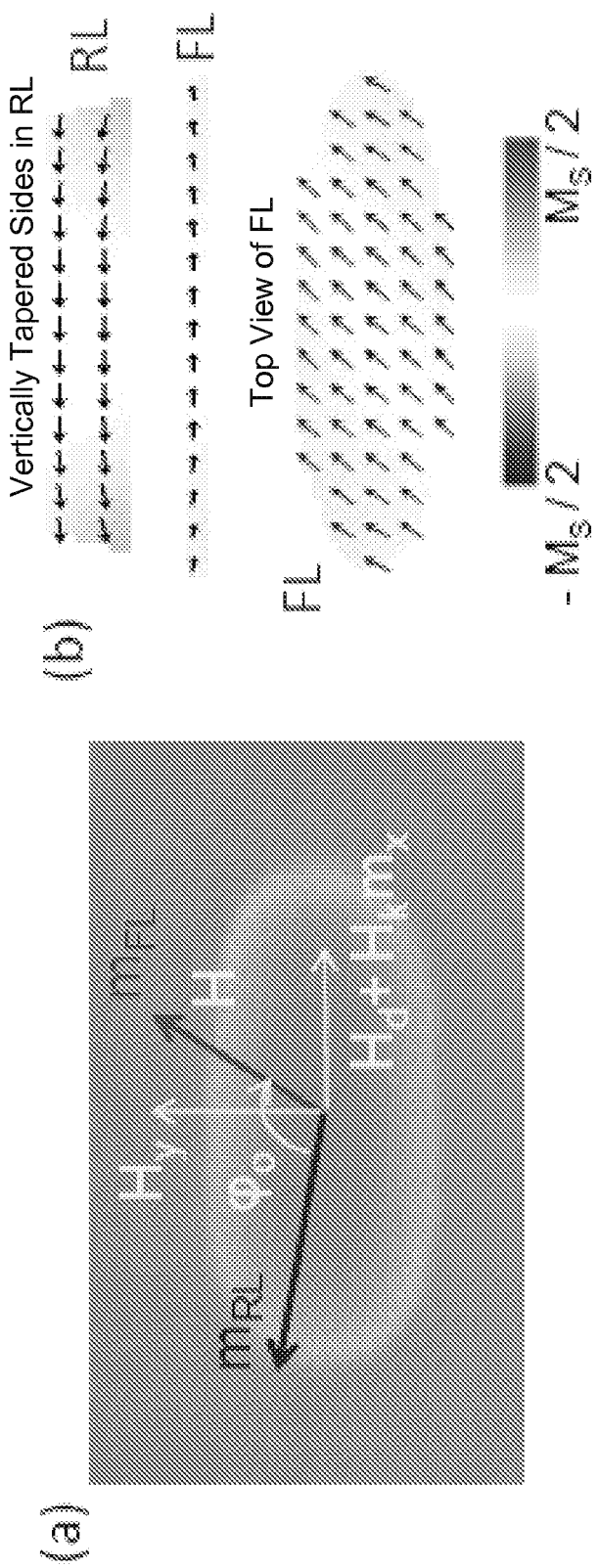
FIG. 9. includes FIGS. 9a and 9b. (a) Schematic of the internal/external fields and the magnetic configuration of the STNO. A top view scanning electron micrograph of one of the spin valve STNO devices before deposition of the top contact. The directions of the reference layer (RL) and free layer (FL) magnetizations are indicated, as are the directions of the applied external field Hy, the dipolar field in-plane component from the reference layer, Hd, the shape anisotropy field and the total effective field H seen by the free layer. (b) Top: cross-sectional representation of the magnetization of the tapered spin-valve nanopillar for Hy=800 Oe and I=0, as determined by micromagnetic simulation. Bottom: top view of the magnetization of the free layer for the same hard-axis field bias. (The color scaling indicates the local out-of-plane Mz component.)

The following sections provide further details on a sample tapered nanopillar spin-valve STNO that was fabricated to include a thin film multilayer stack of Py(5)/Cu(120)/Py(5)/Cu(12)/Py(20)/Cu(2)/Pt(30) (thicknesses in nm) deposited on an oxidized Si substrate, where Py=$Ni_{80}Fe_{20}$, and with the thin (5 nm) FL located closer to the substrate than the thicker ferromagnetic RL. FIGS. 9a and 9b illustrate the in-plane shape in a top view and the shape of the layers along the vertical direction perpendicular to the layers. The bottom Py(5) layer was used to promote adhesion and played no significant magnetic or electrical role. The nanopillar devices, patterned by electron-beam lithography and Ar ion milling, had an elliptical cross-sectional area of ~50×145 $nm^2$ at the bottom of the nanopillar, as measured by scanning electron microscopy (±5 nm). In this structure the thinner FL is located closer to the substrate than the thicker ferromagnetic reference layer (RL) and hence the RL has a higher aspect ratio than the FL due to the sidewall tapering (20°-30° from vertical) during the ion-mill process. A schematic illustration of the tapered geometry is provided in FIG. 9b. As a result of this tapering the shape anisotropy field ($H_k$) of the RL is much higher than for the FL, which fairly strongly fixes the unpinned RL, with a measured coercivity $H_c(RL) \approx 1300$ Oe, greater than the $H_y$ range employed in the experiments, while $H_c(FL) \approx 170$ Oe.

The dipolar field ($H_d \approx 250$ Oe) from the RL acts to orient the FL anti-parallel (AP) to it, giving an offset angle, as averaged over the FL, $\langle \phi_0 \rangle = 180°$ in zero field. We apply an in-plane hard axis magnetic field, $H_y \le 1000$ Oe, that acts to reduce $\langle \phi_0 \rangle$ from 180° towards 90°. Because we still have $\langle \phi_0 \rangle > 90°$, FL oscillations are generated for I<0 such that electrons flow from the RL to the FL. An important aspect of this tapered spin valve structure is that the magnetization at the bottom of the RL is distinctly non-uniform, due to demagnetization field effects as indicated by the micromagnetic static simulation result shown in FIG. 9b. As such, the orientation of the polarization of the spin current that impinges on the FL has a substantial spatial variation across the FL.

Figure 10:
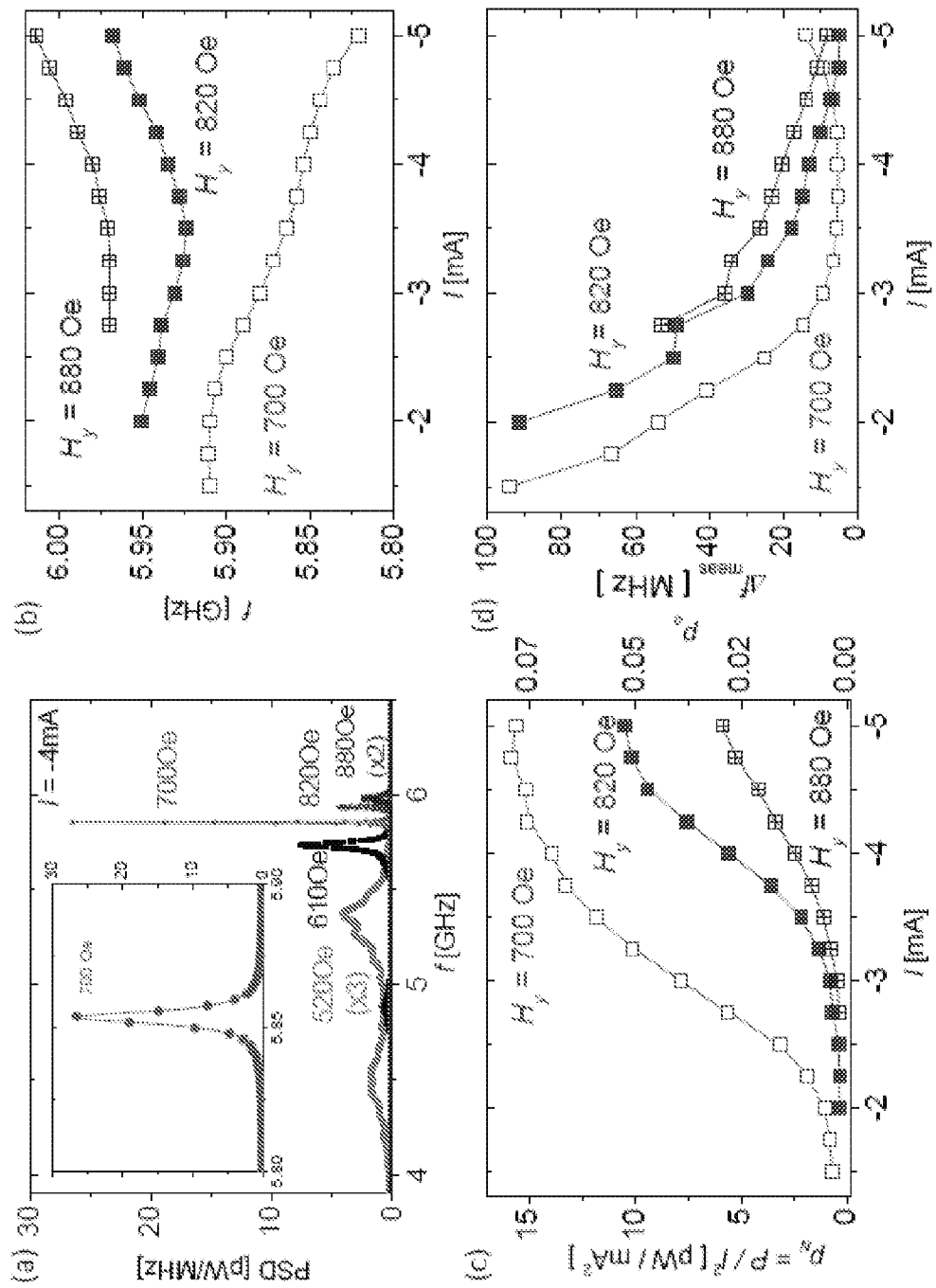
FIG. 10 includes FIG. 10a and FIG. 10 b: (a) Measured PSDs for Hy=520, 610, 700, 820 and 880 Oe at I=−4 mA; (b) oscillator frequency f; (c) oscillator power $P_N$ (=$P/I^2$) and normalized power po; and (d) $\Delta f_{meas}$ as a function of I, all for Hy=700 Oe, 820 Oe and 880 Oe.

FIG. 10a shows the measured power spectral densities (PSDs) of the tapered STNO device at $H_y$=520, 610, 700, 820 and 880 Oe for I=−4 mA. For values of $H_y$ smaller than 650 Oe the STNO exhibited two or more modes with broad linewidths due to mode jumping (for the 610 Oe curve there is a second small peak near f=4.8 GHz), which is associated with the relatively wide spatial distribution of the natural oscillation frequency associated with variations in the internal field across the FL. At and above $H_y$=650 Oe, a single mode is observed, with f increasing with $H_y$ as expected for in-plane oscillation. In this regime the primary signal power is at the fundamental precession frequency.

FIGS. 10b-d show, for the single mode regime with $H_y$=700, 820, and 880 Oe, the values of f, $p_N$ (=P/$I^2$ yielding the power of the underlying resistance oscillations, where P is the measured STNO output microwave power), and $\Delta f$ as a function of |I|, as obtained from Lorentzian fits to the measured PSDs. Notably, the measured $\Delta f$ goes through broad minima as a function of |I| (see the $H_y$=700 Oe curve in FIG. 10d) with the lowest RT linewidths $\Delta f \approx 5$ MHz. Unlike most previous experiments in which narrow linewidths were observed only within very narrow field ranges, we observe $\Delta f \le 8$ MHz for $H_y$ ranging from 650 to 800 Oe, with the minima shifted to larger values of |I| for the larger $H_y$ (FIG. 10d; 5 mA was the largest value of current bias used in the experiment). FIG. 10b shows that for $H_y$ between 700 and 880 Oe, the oscillation f undergoes a crossover from a red shift with |I| ($H_y$=700 Oe) to a blue shift ($H_y$=880 Oe), so that df/d|I| passes through zero in this field bias range. Thus as expected, the bias region where low values of $\Delta f$ are obtained is associated with relatively small values of df/d|I| and therefore |ν|, with the best results depending on the optimum combination of a low df/d|I| and a high $p_N$.

This behavior does not indicate by itself the mechanism by which |ν| and $\Delta f$ are reduced—whether the mechanism involves a low value of |N|, a large value of $\Gamma_{eff}$ or both. However a clear indication that an atypically large value of $\Gamma_{eff}$ is involved is provided by FIG. 10c. There we see that as a function of increasing |I| we eventually observe a saturation in $p_N$ even while the STNO remains in the single-mode regime. Therefore $dp_N/d|I| \rightarrow 0$, which is an indication by Eq. (3) that $\Gamma_{eff}$ is diverging. When $H_y$ is changed, the onset current for the beginning of the saturation in $p_N$ (FIG. 10c) shifts in the same fashion as the onset current for the range of minimum $\Delta f$ (FIG. 10d). The value of $p_N$ at saturation also depends on $H_y$; as $H_y$ moves the initial offset angle between the FL and the RL closer to 90°, $p_N$ at saturation decreases.

A quantitative comparison of our experimental results with the NLAO model requires scaling $p_N$ to estimate the normalized oscillator power $p_0$, which we do by employing the macrospin approximation. First of all we demonstrate one example of how we estimate $p_0$ from $p_N$. Utilizing Eq. (1), together with $E_0 = 2\pi V f^2 p_0/\gamma^2$ and employing the appropriate materials parameters for the Py free layer ($\alpha_G$=0.01, $M_s$=560 emu/$cm^3$) we have $\Delta f_{pred} \approx [6.86(1+\nu^2)/f^2 p_0]$ MHz at T=300 K for our STNO, where f is the oscillator frequency in GHz. To compare the measured linewidth $\Delta f_{meas}$ with $\Delta f_{pred}$ we determined values for $p_0$ under various field and current biases based on the measured power ($P_L$) delivered to the 50Ω ($R_L$) transmission line, that is $$P_L = \frac{1}{2}V_g^2 \frac{R_L}{(R_L + R_S)^2}$$

where $R_S$ is the device resistance ($R_S \approx 25\Omega$) and $V_g$ is the amplitude of the generated microwave signal ($\Delta V(t) = V_g \sin(\omega t)$). A correction was also made for the calculated power lost to the Si substrate. We assumed that the magnetoresistance voltage signal is $\Delta V(t)=I \cdot R(t) \approx I \cdot (\partial R/\partial \phi|_{\phi_o}) \cdot \sin(\omega t) \cdot \epsilon$ (as appropriate for a single-mode 1$^{st}$ harmonic and for the case $\phi_o \leq 135°$) where $$R(\varphi(t)) = (\Delta R_o)\left(\frac{\sin^2\left(\frac{\varphi(t)}{2}\right)}{1 + \chi\cos^2\left(\frac{\varphi(t)}{2}\right)}\right)$$

and $\phi(t) = \phi_o + \epsilon \sin(\omega t)$. We measured $\Delta R_o = 0.2\Omega$ and assumed $\chi=1$ as previously reported for a Py spin valve. We converted the measured $P_L$ to $p_0$ using the simplifying assumption that the FL moment is precessing in a parabolic potential and hence that $p_0 = \sin^2(\epsilon/2)$. We find in the small power limit that $$\epsilon \approx \sqrt{\frac{2P_L}{R_L}} \frac{R_L + R_S}{I \cdot R'(\varphi_o)}$$

with $R'(\phi_o) = dR/d\phi|_{\phi_o}$. We determined the equilibrium offset angle $\phi_0$ between the FL and the RL through the use of the predicted $\phi_0$ dependence of the onset current, $I_c = I_{c0}/|\cos\phi_0|$.

Figure 11:
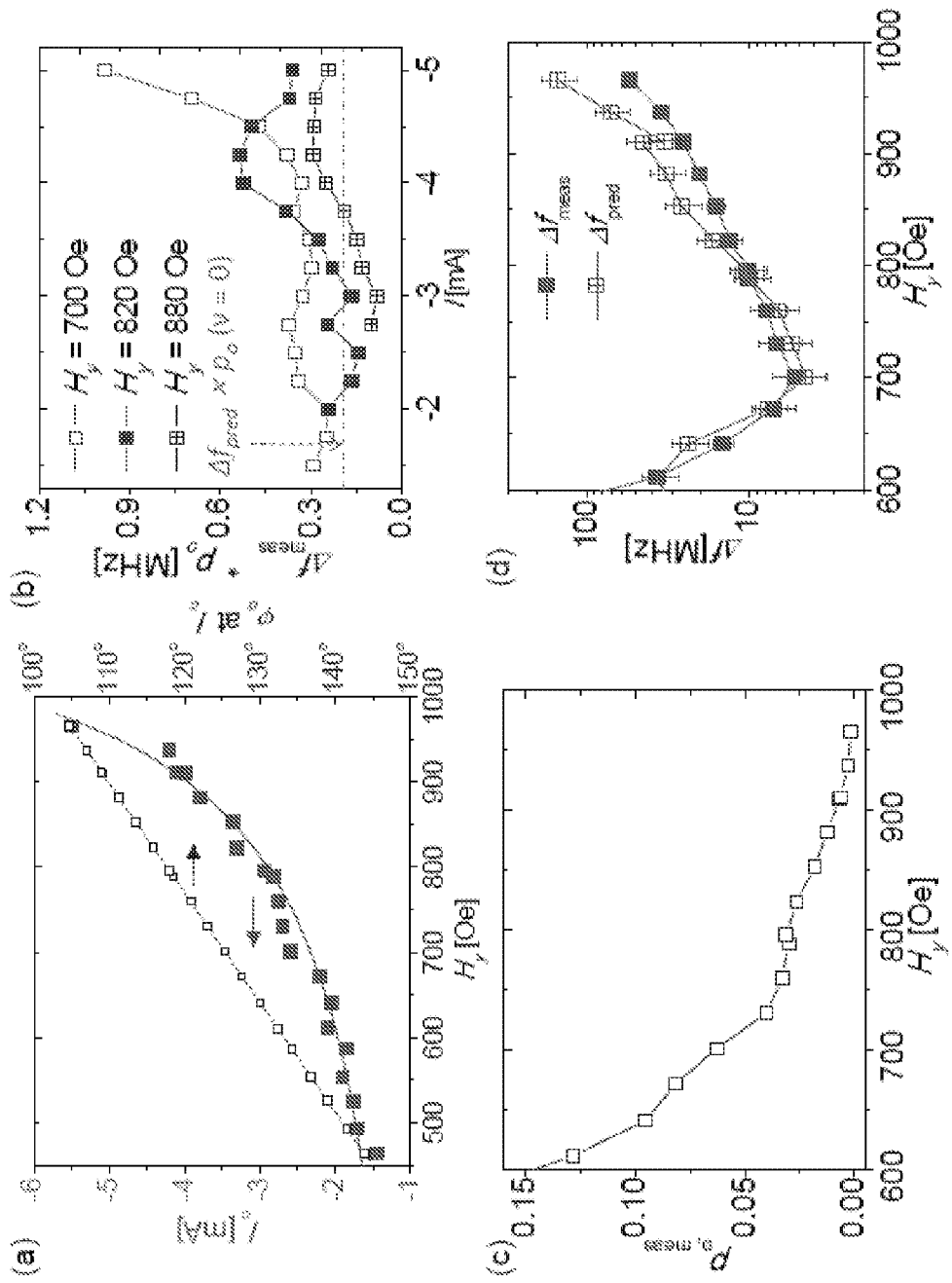
FIG. 11 includes FIGS. 11a, 11b, 11c and 11d. (a) $I_c$ for the onset of the auto-oscillation and the value of the initial offset angle $\phi_o$ determined from $I_c$, both as a function of $H_y$. (b) Measured $\Delta f_{meas} \times p_0$. (c) Normalized oscillator power $p_0$ as a function of $H_y$ for I=−4 mA. (d) Measured oscillator linewidth $\Delta f_{meas}$ for I=−4 mA. Also shown is the predicted linewidth $\Delta f_{pred}$ using the values of $p_o$ shown in (c) and the measured values of I df/dI.

FIG. 11a shows a plot of $I_c$ vs. $H_y$, where $I_c$ is determined by extrapolation of $p_N^{-1}$ to zero in the sub-threshold regime, along with the value of $\phi_o$ for each $H_y$ as indicated by the fit to the predicted variation of $I_c$. As an example, we measure $P_L \approx 225$ pW at $H_y^{opt}=700$ Oe and $I^{opt}=-4$ mA. From the measured onset current of $\sim-2.5$ mA for $H_y=700$ Oe, we estimate $\phi_o \approx 126°$ (see FIG. 11a), and thus obtain $\epsilon \approx 28.5°$.

Both macrospin modeling and the micromagnetic simulation discussed later indicate that the orientation of the precession axis $\phi_o$ shifts toward 90° as a function of increasing bias current (and increasing oscillation power) in this field regime due to the non-parabolic nature of the magnetic energy potential. This potential is beneficial in providing some agility in the regime where the anisotropy fields are fairly closely balanced. Thus for $I^{opt}=-4$ mA $\phi_o$ could be as small as ~116° in this example. This would nevertheless result in only a negligible correction to the estimated oscillation amplitude ($\epsilon \approx 29.1°$). Similarly, while the determination of $I_c$ has a significant uncertainty due to the fact that we assumed macrospin behavior in estimating $I_c$ from the variation of p with I in the threshold region, while the MMS indicates a gradual onset even in the absence of thermal fluctuations (see FIG. 13a), this results in only a small uncertainty on the determination of $\phi_o$. For $\epsilon \approx 29°$, we have $p_0 \approx 0.063$. At $I=-4.0$ mA we measure $f \approx 5.854$ GHz and $df/dI \approx -16$ MHz/mA, which yields $\nu \approx -0.65$ and thus $\Delta f_{pred} \approx 4.6 \pm 1.3$ MHz, quite close to $\Delta f_{meas} \approx 5 \pm 2$ MHz.

FIG. 11b shows a plot of $\Delta f \times p_o$ as determined in this manner from the measured data of FIG. 10b-d. Over a wide range of I and $H_y$ we see that while $p_o$ varies by a factor of 30, $\Delta f \times p_o$ varies by ≤2 and is within a factor of two of the predicted linear oscillator value $\Delta f_{pred} \times p_o \approx 0.19$ MHz (for $\nu=0$, f=6 GHz, $\alpha_G=0.01$, $M_S=560$ emu/cm$^2$, V=2.9×10$^4$ nm$^3$), in accord with Eq. (1).

FIGS. 11c and 11d show, respectively, $p_o$ and $\Delta f_{meas}$ as a function of $H_y$ for $I=-4$ mA. As $H_y$ increases from 600 Oe $\Delta_{meas}$ decreases rapidly, reaching its minimum ≈5 MHz at $H_y^{opt} \approx 700$ Oe, and then increases again with higher $H_y$, while $p_o$ decreases monotonically. Also shown in FIG. 11d is the NLAO prediction $\Delta f_{pred}$, as determined from Eqs. (1) and (3) using the estimated values of $p_o$ and the measured values of I df/dI. There is quite good agreement between experiment and the prediction for $H_y$ from 675 Oe to 800 Oe.

Figure 12:
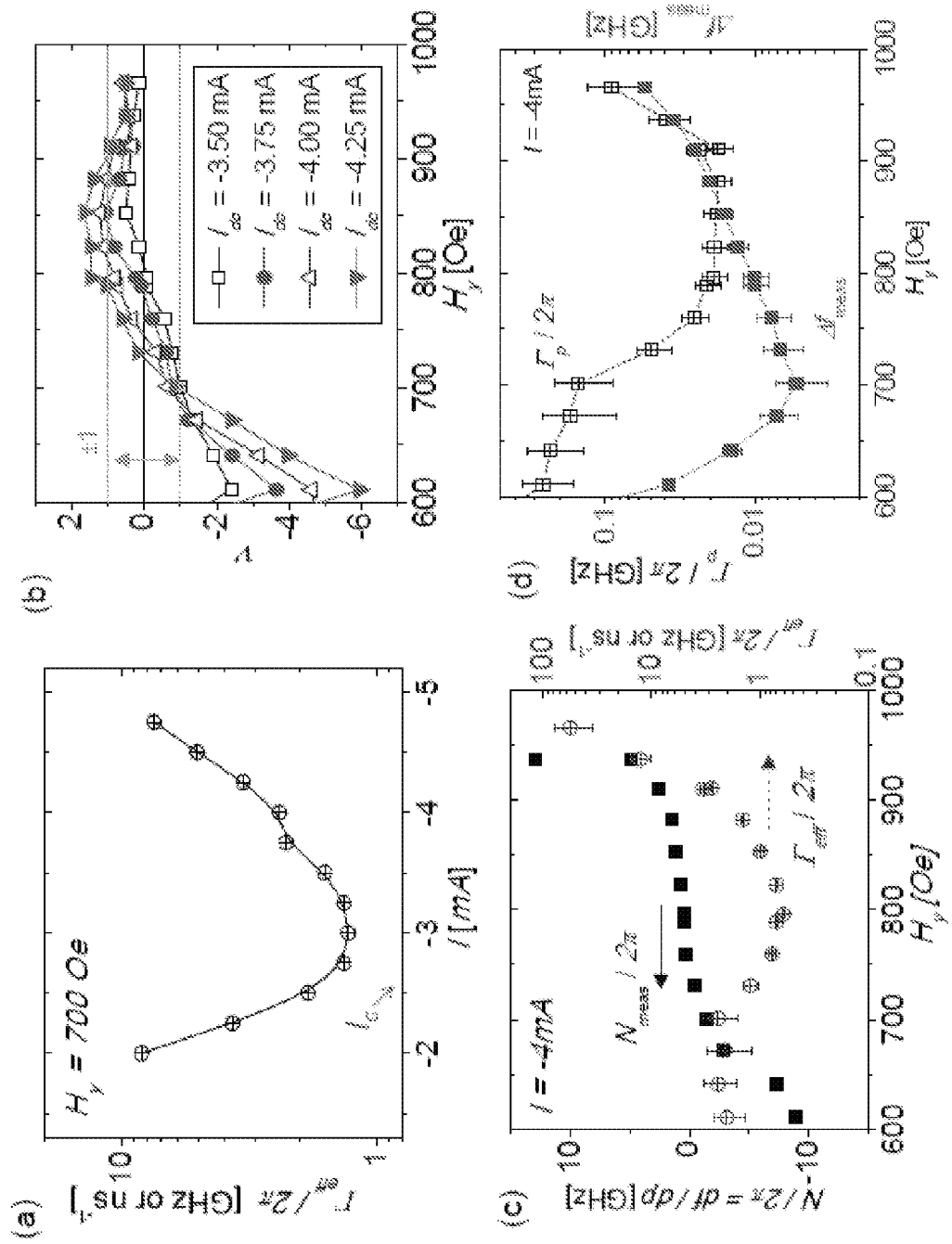
FIG. 12 includes FIGS. 12a, 12b, 12c and 12d. (a) Effective damping vs. I for $H_y$=700 Oe. Up to $I_c$ (≈−2.6 mA) $\Gamma_{eff}/2\pi$ drops rapidly with increasing I due to the anti-damping ST effect on the thermally generated oscillation. Above −3.25 mA, $\Gamma_{eff}/2\pi$ increases approximately linearly as the variation of oscillation power with bias becomes weaker and weaker. (b) Non-linear coupling constant v as determined from I df/dI and Eq. (3) vs. $H_y$ at several different bias currents I. (c) N/2π=df/dp₀ and $\Gamma_{eff}/2\pi$ of the STNO vs $H_y$ for I=−4 mA. (d) Dynamic damping parameter $\Gamma_p/2\pi$ (=$p_0\Gamma_{eff}/2\pi$) of the STNO as determined from the experimental data using Eq. (3) as a function of $H_y$, for I=−4 mA. Also shown are $\Delta f_{meas}$ for comparison.

FIG. 12a shows a plot of $\Gamma_{eff}/2\pi$ vs. I for $H_y=700$ Oe. Below $I_c$ (≈-2.6 mA) $\Gamma_{eff}$ decreases rapidly with increasing I as expected for sub-threshold behavior, plateaus for $I \approx I_c$ at $\Gamma/2\pi \sim 1$ GHz, and then increases again as $p_o$ begins to saturate with I.

The NLAO model can be used to determine ν using Eq. (3), obtaining the results shown in FIG. 12b. The quasi-linear behavior ($|\nu|\leq 1$) can be obtained in such an STNO device over a significant range of $H_y$ and I. Notably, FIG. 12b suggests that the STNO can be operated under a range of Hy between 700 Oe and 800 Oe to achieve the quasi-linear behavior ($|\nu|\leq 1$) for currents between −3.50 mA and −4.00 mA. We determine the individual contributions of N and $\Gamma_{eff}$ to this result by evaluating $N/2\pi = df/dp_0$ using the measured values of f and the estimated values of $p_0$ and by evaluating $\Gamma_{eff}/2\pi$ from Eq. (3) (FIG. 12c). While the values of $N/2\pi$ that we find in the optimal regime, where there is a gradual red shift to blue shift transition in the agility as a function of $H_y$, are in a range comparable to a previous STNO experiment of a different design (N/2 π~1 GHz), the values of $\Gamma_{eff}$ in our experiment ($\Gamma_{eff}/2\pi \sim 1$-3 GHz), are more than ten times greater.

The power restoration rate $\Gamma_p = p\Gamma_{eff}$ characterizes the dynamic damping of a STNO. As shown in FIG. 12d, for the device discussed in the main text $\Gamma_p/2\pi$ ranges from 0.3 ns$^{-1}$ to 0.02 ns$^{-1}$ for 600 Oe<$H_y$<850 Oe. This rapid relaxation of power fluctuations is the result of the very strong $\Gamma_{eff}$ in our device configuration despite its relatively low power p. Above 900 Oe, $\Gamma_p$ increases rapidly despite the rapid decrease in p due to the very strong enhancement in $\Gamma_{eff}$ (dp/dI→0) as $\phi$ approaches 90°, indicating that here deviations in oscillator amplitude very quickly stabilize to the mean precession orbit, as previously implied by micromagnetic simulations. We also plot the oscillator linewidth $\Delta f_{meas}$ in FIG. 12d for comparison to $\Gamma_p$. Note that above 850 Oe the two are comparable which explains why in this field regime $\Delta f_{meas}$, while increasing rapidly due to the decreasing p, becomes progressively less than predicted by the nonlinear theory (see FIG. 11d) since the derivation of Eq. (1) requires $\Delta f \ll \Gamma_p/2\pi$.

While we have found that the application of macrospin modeling and analysis of our device can provide some helpful, indeed essential, general understanding of the overall STNO behavior, we also find that those approaches are not successful in quantitatively explaining, with any reasonable choice of parameters, either the extended field bias region, ~700 Oe to 900 Oe, where the device agility is substantially reduced from more typical STNO values, nor the very nonlinear behavior of the effective damping with bias current variation in this field bias region. Therefore we have performed zero temperature micromagnetic simulations (MMS) of the idealized elliptical STNO that include the spin torque effect to gain better insight into the origin of the enhanced dynamic damping and the coherent oscillations in our STNO design.

Figure 13:
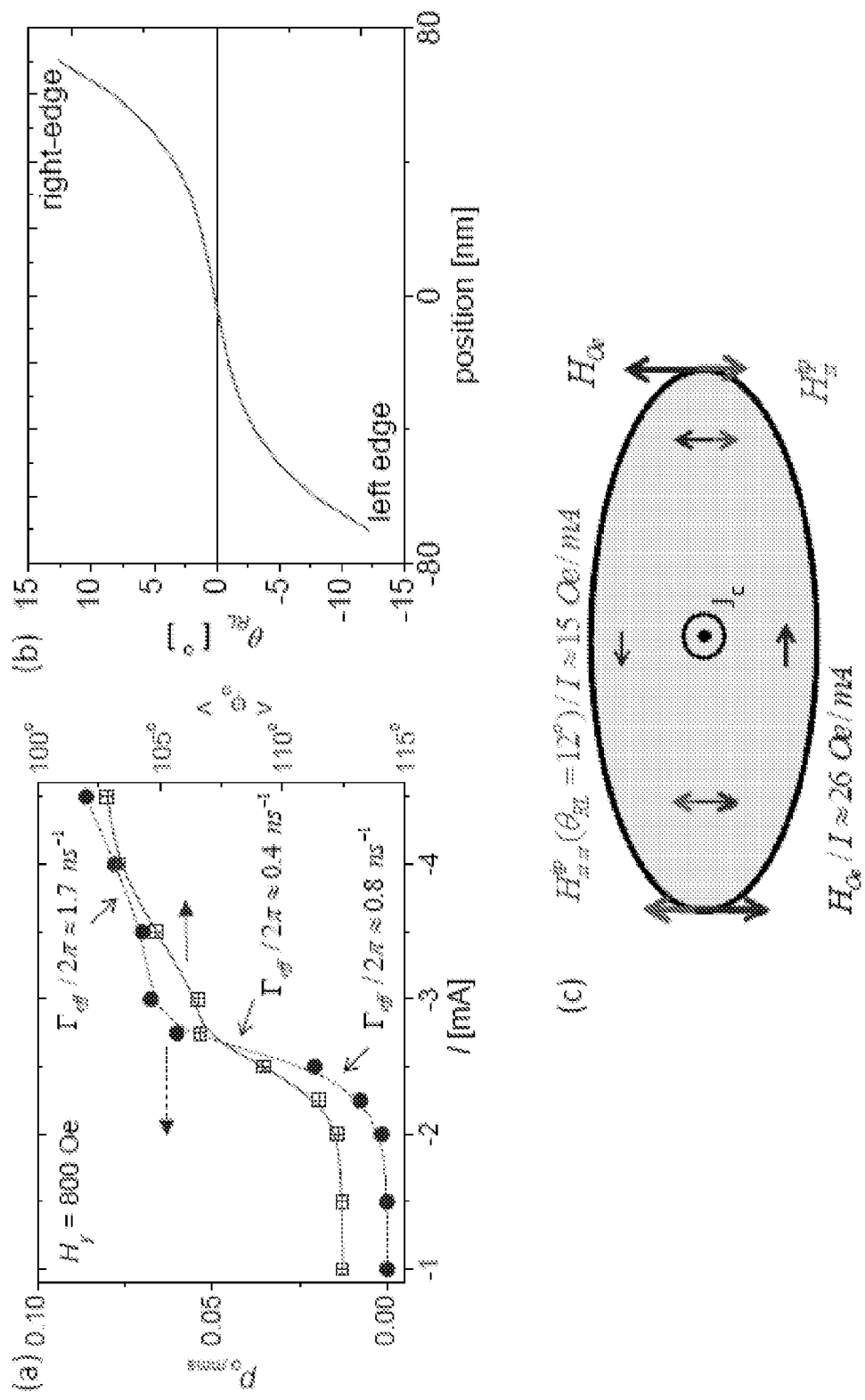
FIG. 13 includes
Figure 14:
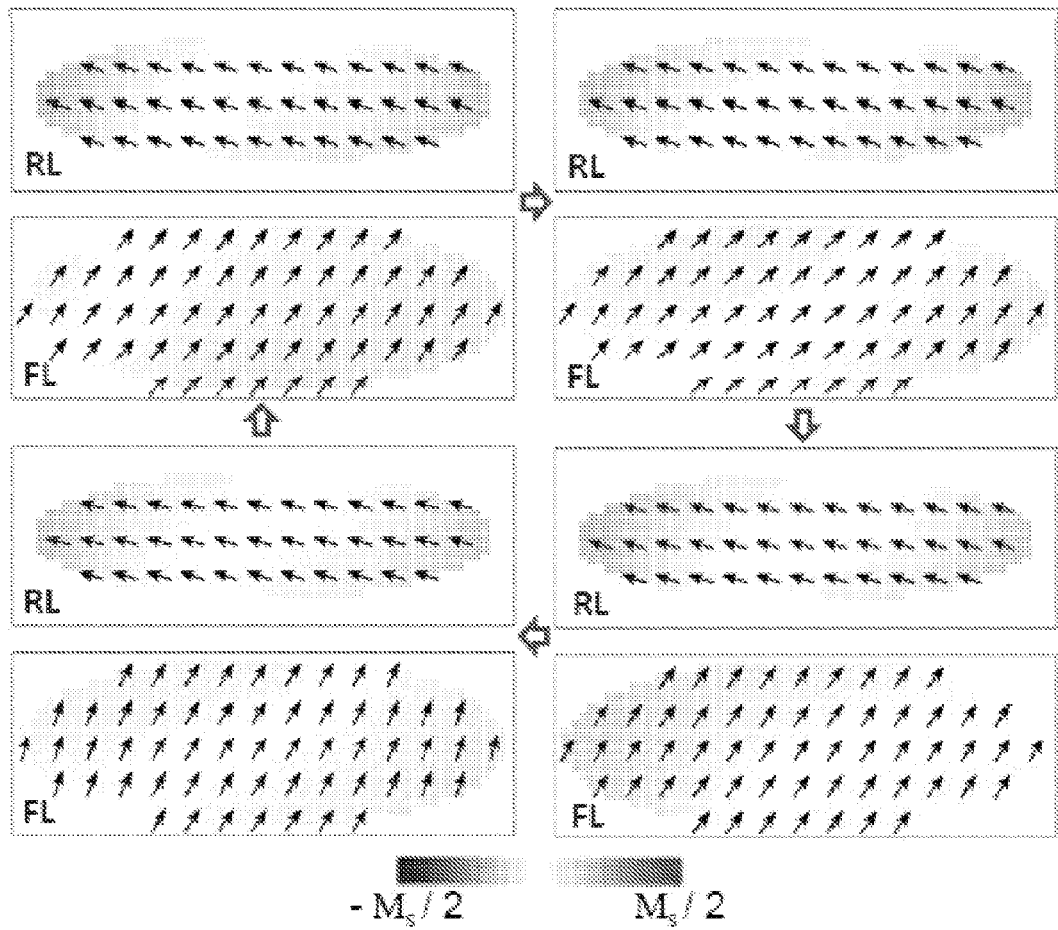
FIG. 14 shows time varying snapshots of the FL and RL magnetization during one cycle of the micromagnetic simulated oscillation for $H_y$=800 Oe, I=−2.25 mA.
Figure 15:
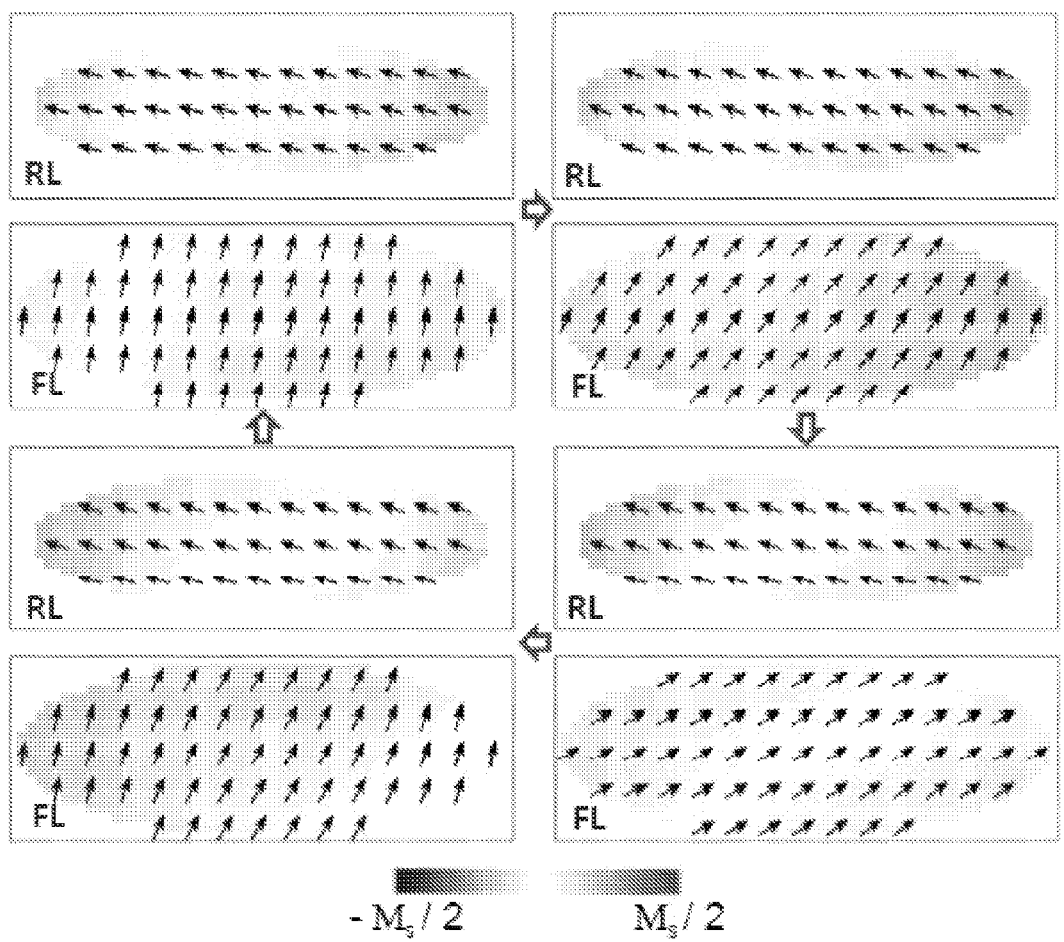
FIG. 15 shows time varying snapshots of the FL and RL magnetization during one cycle of the micromagnetic simulated oscillation for $H_y$=800 Oe, I=−2.5 mA.
Figure 16:
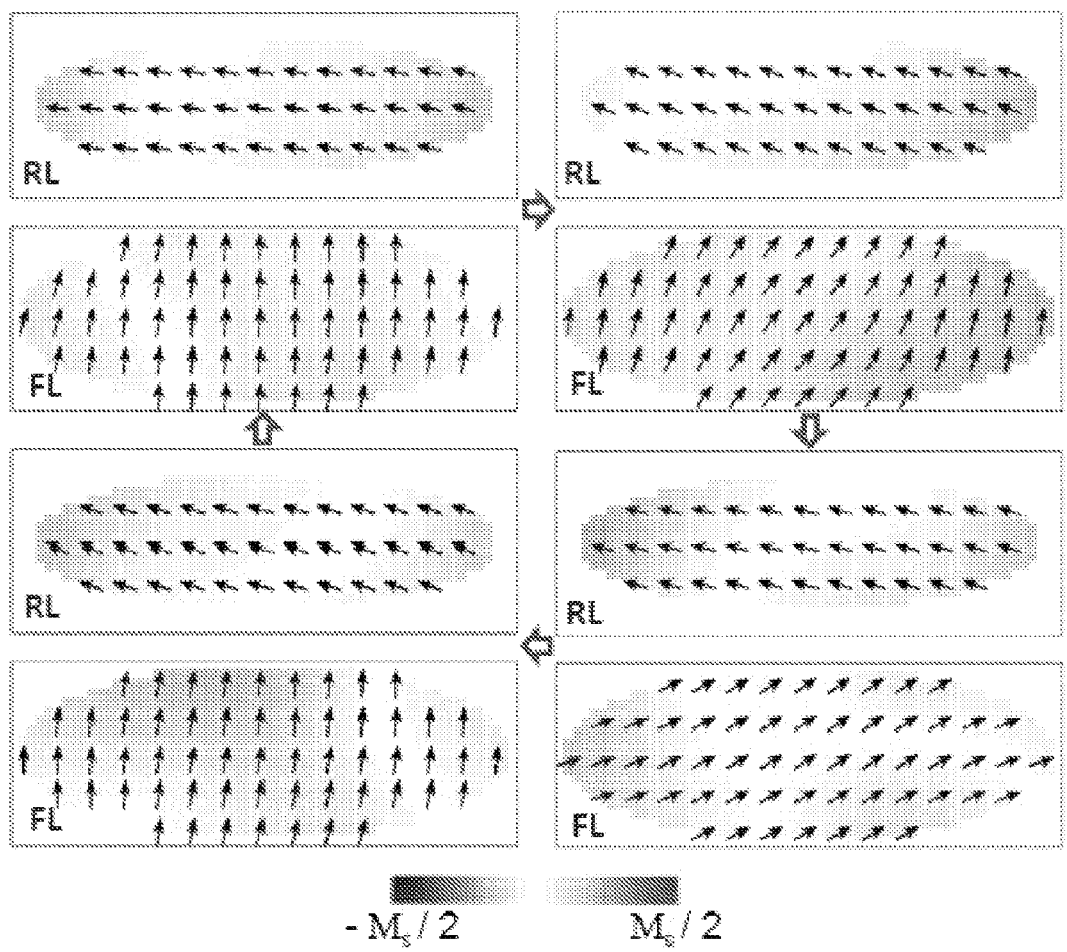
FIG. 16 shows time varying snapshots of the FL and RL magnetization during one cycle of the micromagnetic simulated oscillation for $H_y$=800 Oe, I=−4.0 mA. The ST applied to the center area drives the oscillations while the ST at the edges provides enhanced dynamic damping when the local orientation between the FL and RL magnetization is near 90°.

To confirm the applicability of the MMS results to our device, FIG. 13a shows the power of the MMS oscillation $p_{o,mms}$ as a function of I for T=0 and $H_y$=800 Oe, which exhibits both a gradual onset above $I_c$, and the quasi-saturation behavior seen experimentally (FIG. 10c.) The power of the STNO oscillation signal exhibits a sensitive increase region in the current range of −2 mA to −3 mA and shows a power saturation when the current increases beyond −3 mA where the rate of the power increase begins to decrease beyond −3 mA. Therefore, under T=0 and $H_y$=800 Oe, the DC current for this STNO should be set around −3 mA to achieve the maximum power. We attribute the quantitative differences in behavior to differences in the actual size and shape of the device, and to the measurements being performed at room temperature, not T=0. In general, when I=−3~−5 mA were applied for $H_y$=700-1000 Oe, we consistently obtained quite coherent oscillations of the simulated FL, when averaged over the FL and over many cycles, as illustrated in FIGS. 14, 15 and 16. However, the micromagnetic details of the oscillations are significantly more complex than the uniform, in-plane "clam-shell" elliptical precession predicted by macrospin modeling. Due to the non-uniform out-of-plane magnetization (OPM) of the RL, when I (<0) is applied, there is significant spatial variation in the direction of polarization of the current incident on the FL, which is the origin of the enhanced non-linear dynamic damping of the ST induced oscillations of the FL.

FIG. 13b shows a plot of the OPM component $M_z$, in the bottom end regions of the RL as determined by the MMS for the static case $H_y$=800 Oe and I=0 which was used to obtain the magnetization distributions for the spin valve shown in FIG. 1b. Due to the tapered geometry of the RL $M_z$ increases to 12% of the total magnetization at the ends of the RL. The MMS suggests that this OPM plays a significant role in the dynamics because the current incident on the FL end regions has a significant out-of-plane polarization (OPP) component that acts to induce the magnetization of the right (left) FL end region to have a significant time-averaged +z (−z) component.

The MMS indicates that at threshold, I≈$I_c$, the principal effect of the non-uniform spin torque is that the in-plane (IP) "clam-shell" precession of the FL does not proceed uniformly as it would for a rigid domain with a purely IP ST. Instead the $M_z$=0 crossings of the IP oscillation are non-uniform in time across the FL (see FIG. 14 for I=−2.25 mA), due to the opposite "biasing" of the time-averaged OPM in the two ends, $\langle M_{z,L} \rangle$ <0 and $\langle M_{z,R} \rangle$ >0. The MMS indicates that this phase difference reduces the overall efficiency of the in-plane ST for a given I (reduces the oscillation energy) in comparison to a fully in-phase case, and thus raises $I_c$ in comparison to that predicted for a rigid domain and retards the growth of p (oscillation amplitude ε) with I just above $I_c$ (enhances $\Gamma_{eff}$). This results in the in-plane precession in the right end region leading (lagging) that in the left end during the half cycle for which the time-varying demagnetization field in that end is enhanced (reduced) by the effect of the OP ST. Since the OP ST and IP ST increase together with I, the result at first is a slower than otherwise expected rate of increase of $p_0$ with I, and hence a higher effective dynamic damping of the oscillation (see FIG. 14 for I=−2.25 mA).

As ε increases further with I, e.g. I≈−2.5 mA in the simulated device, the stronger exchange coupling of the oscillation across FL due to the larger in-plane precession amplitude reduces the fraction of the cycle where sgn($M_{z,L}$)≠sgn($M_{z,R}$). This enhances the efficiency of the IP-ST and is the origin of the increased dp/dI, which reduces $\Gamma_{eff}$ in this bias region, $\Gamma_{eff}/2\pi \approx 0.4$ GHz (see FIGS. 12a and 15 for I=−2.5 mA and −3 mA), although still keeping it higher than expected from macrospin modeling, $\Gamma_{eff}/2\pi \approx \Gamma_0/2\pi \approx 0.1-0.2$ GHz.

Eventually however, for sufficiently high I, ε in the end regions becomes large enough that the extremum of the IP offset angle $\phi_{min}=\phi_0-\epsilon$ is reduced to ~90° relative to the RL. At that point the instantaneous IP ST exerted on the FL has its maximum strength. When I is increased further there is a decreasing amount of net "anti-damping" torque on the FL for increasing precession amplitude, while $\tau_d$ continues to grow with ε. In the MMS this occurs for I≈−3.0 mA. At that precession amplitude, for which ε≈30°, the effectiveness of the IP anti-damping ST on the FL decreases rapidly with further increases in ε while the positive damping $\Gamma_+\epsilon$ continues to increase, which reduces the differential (i.e. anti-damping) ST effect of increasing I.

Moreover, the MMS indicates that once φ varies to below 90° during the oscillation the "back-action" ST exerted on the RL by the anti-parallel spin-polarized electrons reflected from the FL is sufficient, due to the lowered demagnetization field in the end regions of the RL, to set those regions into significant precession about their local effective fields that point partially out of plane, thus periodically increasing and decreasing the OPP of the current incident on the FL. The MMS indicates that this makes the large-amplitude in-plane FL precession less uniform across the FL, which strongly reduces the efficiency of the IP ST (See FIG. 16). The effect is a strong enhancement of $\Gamma_{eff}$ for |I|>3 mA in the MMS (see FIG. 13a), while the time and spatially averaged MMS oscillation remains relatively coherent. Above this current bias level the ST induced oscillations of the RL ends grow in amplitude with increased I and the coherency of the FL in-plane oscillation gradually degrades, which we suggest is the origin of the broadening of Δf in the experimental device illustrated in FIG. 10b for the case of $H_y$=700 Oe, and |I|>4.0 mA. When MMS are performed with higher values of $H_y$, higher levels of I are required, both to initiate steady state oscillation and to bring $\phi_{min}$<90° and hence cause quasi-saturation in $p_0$, in general accord with experiment.

The micromagnetic simulations further serve to demonstrate an additional beneficial effect of the OPM component at the bottom ends of the RL, in that it also aids in the achievement of coherent quasi-uniform oscillations, particularly at the higher bias currents. This is because the orthogonal, out-of-plane component of the spin current incident on the FL not only acts to produce time-averaged out-of-plane components of the free layer magnetization, $\langle M_{z,L} \rangle$ <0 and $\langle M_{z,R} \rangle$ >0 at the left and right ends respectively, it also has the effect of exerting a torque on the FL magnetization in those end regions that, to first order, is equivalent to the presence of an effective magnetic field, $$\vec{H}_{st}^{ip} \sim \vec{m} \times \vec{p} \sin(\theta_{RL}),$$

where $\vec{p}$ is the spin-polarization of the RL and $\theta_{RL}$ is the out-of-plane angle of that polarization. This $\vec{H}_{st}^{ip}$ acts to counter-balance the circumferential Oersted field generated by the bias current in the end regions as illustrated in FIG. 13c. On the FL along the easy axis, $H_{st}^{ip}$ is clockwise, opposite to $H_{Oe}$ and the estimated $H_{Oe}$≈26 Oe/mA for I=−4 mA is partially cancelled by $H_{st}^{ip}$≈15 Oe/mA assuming $\theta_{RL}$≈12° as determined by averaging the modeled RL magnetization over several end region cells. We established the importance of this counterbalancing by carrying out simulations where the Oersted field was not included. This resulted in the oscillation becoming much less coherent at high current biases due to the substantially different effective fields at the two ends of the FL. Thus the OPP component of the incident spin polarization not only results in the enhanced nonlinear dynamic damping, it also allows for the application of a higher bias current, hence the achievement of a higher $p_0$, before nonlinear effects lead to the onset of multiple modes. Since $H_{st}^{ip}$ depends on the local out-of-plane orientation of the RL magnetization $\theta_{RL}$, the current polarization P, and the angular dependence of the spin torque function $g(\phi)$ an even closer balance of the Oersted and ST fields might be achievable with careful tuning of the device geometry (taper) and choice of material.

We suggest that the enhanced nonlinear dynamic damping illustrated in the MMS and observed experimentally is a natural consequence of the non-collinear and non-uniform magnetic configuration in our device, and that the OP ST component that arises from the bottom of the tapered ends of the RL is principally responsible for the negative feedback (i.e., large $\Gamma_{\mathit{eff}}$) that suppresses power fluctuations, an effect that cannot be captured in macrospin modeling. When the bias is increased sufficiently above threshold that $\phi$ becomes $\leq 90°$ in the end regions during the extremum of the cycle, the magnitude of the ST interactions between the FL and the less stable end regions of the RL is enhanced, resulting in momentarily stronger OPM there. This leads to a further increase in the strength of the negative feedback—a fluctuation to a larger instantaneous precessional power ($\epsilon$) results in a rapid suppression of the fluctuation. Mathematically, for this device the anti-damping caused by the IP ST, $\Gamma_{-}(p, I)$, becomes a strongly decreasing function of p near values of p corresponding to $\phi_{min} \approx 90°$, leading to the large enhancement of $\Gamma_{\mathit{eff}} \approx -\partial \Gamma_{-}(p, I)/\partial p$. This differs from the case of collinear STNOs with uniform ST where the anti-damping is predicted to have the simple form $\Gamma_{-}(p, I) = \sigma_0 (1-p)I$.

The above analysis shows how an enhanced dynamic damping can reduce the nonlinear coupling that limits the phase stability of conventional STNOs, and also demonstrates that an enhanced $\Gamma_{\mathit{eff}}$ can be realized by employing a tapered, non-collinear device configuration, where an OP ST component can provide a strong negative feedback control that restricts power fluctuations. This greatly reduces the effects of coupling between amplitude and phase fluctuations that hinders the phase stability of conventional STNOs. The sample STNO geometry nevertheless remains frequency agile to a useful degree (FIG. 10b) due to the variation of the precession axis with bias current. Thus it allows a moderate frequency shift $|\Delta I \, df/dI| >> \Delta f$ even where $|v| \leq 1$. In the implementation of the negative feedback strategy discussed here the maximum normalized power is relatively low, $p_o \leq 0.08$. This helps ensure that the oscillating FL does not have sufficient energy to break up into multiple modes in the presence of the spatially non-uniform anti-damping and damping spin torques and a non-uniform internal field distribution, but it also limits the minimum attainable quasi-linear $\Delta f$. Further refinements that both utilize this non-linear effective damping approach can be expected to result in a quasi-linear STNO that can reach normalized power levels, $p_o >> 0.1$, before being saturated by the negative feedback damping. This, and/or the use of a FL with a higher magnetic moment and hence greater possible STNO energy, would yield STNOs with $\Delta f < 1$ MHz. Implementation of this non-linear effective damping approach in magnetic tunnel junction STNOs, and with configurations that do not require external fields, have the potential of further advancing STNOs towards viability for technological applications.

The disclosed technology relates to spin-torque excited nanoscale oscillators where a spin-polarized electrical current, or alternatively a pure spin current, excites a nanoscale magnetic element or magnetic domain into persistent magnetic oscillation at a microwave frequency set by the magnetization of the element and the effective internal magnetic field. More specifically, the disclosed technology includes a method and system whereby the inherently non-linear nature of a spin torque nano-oscillator, which leads to an adverse coupling of amplitude and phase fluctuations that degrades the phrase stability of the oscillator, can be greatly reduced and even effectively eliminated by an internal spin torque mechanism that introduces intrinsic negative feedback of power fluctuations into the device operation.

A spin torque nanoscale oscillator (STNO) can be configured as a compact electronic device having a thin film ferromagnetic nanostructure or extended layer where the magnetization of this ferromagnetic element is locally excited into magnetic oscillation by what is referred to as an anti-damping spin transfer torque that is exerted by a spin-polarized current of electrons that impinges on the ferromagnetic element. This spin polarized current can be produced by passing an electrical current through one or more, but at least one, magnetically stable thin film ferromagnetic layer(s) that is (are) placed adjacent to the excited ferromagnetic element, but separated from it by a thin normal metal layer or by a very thin, tunnel barrier layer, such as for example magnesium oxide (MgO), that facilitates the tunneling of spin polarized electrons from the stable ferromagnetic element or elements to the excited element. The magnetic stability of the second ferromagnetic element, and possibly a third or more, is achieved by virtue it being, for example, either thicker and hence more difficult to excite by the transfer of spin torque from the current, or by being in contact with an anti-ferromagnetic layer that acts to pin its magnetization in a preferred direction. This magnetic stability of the other ferromagnetic components does not have to be complete as some smaller, sympathetic magnetic oscillations within the other layers can be beneficial to the overall oscillator performance.

In some implementations, the required spin polarized current of electrons can be generated by the spin Hall effect wherein a longitudinal electrical current flowing through a "spin Hall material" layer, which is a high atomic number normal metal thin film layer, such as Ta or W or some other metal layer in which the conduction electrons have a strong spin orbit interaction, generates a transverse current of spin-polarized electrons that impinges onto and can excite magnetic oscillations in a ferromagnetic element that is placed adjacent to and in electrical contact with the spin Hall material.

The magnetic excitation of the ferromagnetic element arises via the process known as spin transfer thereby the majority of the net transverse component of the spin angular momentum of the spin polarized electrons that impinge onto that ferromagnetic element is absorbed by the element's magnetic moment, which has the effect of exerting a magnetic torque on that moment. Depending on the direction of the net spin polarization relative to the orientation of the moment, this torque acts to oppose, or if in the opposite direction, to enhance the so-called damping torque that relaxes magnetic excitations in ferromagnetic elements back to equilibrium. If the spin transfer torque is in the direction to oppose the damping torque it is referred to as an "anti-damping spin torque." When in that latter case the polarized spin current density is high enough the anti-damping spin torque can exceed the damping torque. At that current bias level and above transient magnetic excitations are amplified rather than damped, and the element will be set into persistent magnetic oscillation, provided the magnetic moment upon excitation cannot move into an alternative magnetic configuration where the spin torque becomes a damping torque and suppresses excitations. For spin torque nanoscale oscillators this magnetic reversal is avoided by placing the ferromagnetic element in a net internal magnetic field configuration that only allows for one stable, equilibrium point. (For magnetic memory applications a magnetically bi-stable configuration is established, which can result in reversible spin transfer torque switching of the magnetic moment orientation between the two stable configurations.)

The principal practical value of STNOs is that the magnetic oscillation can be employed to generate an electromagnetic signal at either the fundamental or a harmonic of the frequency of that oscillation. This is possible because of the change in resistance, known as the magnetoresistance, which develops between the oscillating element and an adjacent fixed ferromagnetic element that depends on the instantaneous relative magnetic orientation of the fixed element to that of the oscillating element. This magnetoresistance is that experienced by either an electrical current flowing between the two ferromagnetic elements, through a thin normal metal layer, or by an electrical current that quantum mechanically tunnels through a very thin insulator layer, such a magnesium oxide or some other insulating material of order of 1 nm in thickness, that is inserted between those two ferromagnetic elements. These two cases generate either a time-varying giant magnetoresistance or a time-varying tunneling magnetoresistance signal respectively, resulting in the production of a microwave voltage whose amplitude is determined by the magnitude of the magnetoresistance change times the applied dc sensing current. Most commonly this sensing current is also the spin-polarized current that exerts the spin torque that excites the magnetic oscillation, but if the spin Hall effect is employed to exert the spin torque on the oscillating ferromagnetic element the magnetoresistance sensor can be separately biased, resulting in a more versatile STNO device structure.

A variety of nanoscale device geometries have been employed to produce STNOs. Approaches include mechanical point contacts, nanopillar spin valve structures, nano-constrictions that contact extended magnetic multilayer films and nanoscale magnetic tunnel junctions (MTJs). The oscillating magnetic element has been either a fully patterned nanoscale thin film layer, or the localized region of an extended ferromagnetic film surrounding the area into which a polarized spin current is injected. The mode of magnetic oscillation can vary from being the precession of a more or less uniformly magnetized region of the excited magnetic element about its equilibrium position set by the internal magnetic fields, to, for example, the precession of a magnetic vortex in the thin film element about its equilibrium position.

The frequency (frequencies) of a STNO's mode (modes) of oscillation is (are) determined by the saturation magnetization of the excited ferromagnetic element and by the internal magnetic field distribution associated with that mode of excitation. For best performance a STNO should have only one dominant mode of oscillation, which depending on the internal field and magnetization of the excited ferromagnetic element, can range from below 0.5 GHZ to greater than 20 GHz, but most commonly, STNO operating frequencies fall within the 0.5-20 GHz range, which covers most of the electromagnetic spectrum utilized for public and commercial communications.

Since the initial demonstration of a spin torque nano-oscillator there has been substantial progress in understanding the details of the nanomagnetic dynamics exhibited by various types of STNOs and on enhancing the microwave power output of STNOs. There have been two primary approaches taken. The first has been to phase-lock, by either a magnetic or electromagnetic interaction, two or more STNOs together to achieve a single mode of coherent oscillation with enhanced oscillation power and reduced phase noise. The other approach has focused on STNOs that utilize magnetic tunnel junctions (MTJs) structures as the magnetoresistance sensor since the tunneling magnetoresistance, as a percentage of device resistance, can be much greater than that achievable with an all-metal, spin valve structure. MTJs also typically have much higher impedance, which can better match the STNO output impedance to semiconductor electronics. However, current nanoscale MTJs have impedance levels that are not closely matched to strip-line impedances for on-chip applications.

In addition to its output power, a fundamental performance parameter of any electromagnetic oscillator is its phase stability, or spectral linewidth ($\Delta f$). To achieve good oscillator performance it is essential that it have a stable as possible mode of oscillation. This is a challenge for the development of STNOs since their small size, which is their attractive attribute, also results in the maximum achievable magnetic energy of the oscillator being limited in amplitude. Since the phase stability of an ideal oscillator depends directly on the ratio of the oscillator's steady state energy to the time average value of any noise energy input, thermal fluctuations set a fundamental floor to $\Delta f$ of a STNO that varies inversely with the magnetic energy of the oscillation. Note that the oscillator's magnetic energy is not the same as the device's microwave output power as the latter also depends on the characteristics of the magnetoresistance sensor. Increasing the volume of the oscillating magnetic region to achieve higher oscillator energy offers only a limited solution to increasing phase stability since achieving a single mode of oscillation requires that the lateral extent of the magnetic element be less than that required to energetically support a domain wall, which is typically on the order of 100 nm for most STNO ferromagnetic materials. There is also a limit to the achievable amplitude of a STNO oscillation, as too high an energy density will result in secondary modes of oscillation becoming energetically favorable, which will degrade performance.

In general the frequency of a STNO varies with its oscillation amplitude, or normalized power, which in turn varies with the strength of the applied spin polarized current, most typically in a more or less linear manner above the threshold current that initiates the oscillator. This STNO "agility," that is the variation of its frequency with oscillator power, is seemingly an attractive feature for many potential applications, but it also results in the STNOs being non-linear, in that its amplitude fluctuations result in frequency fluctuations. This directly degrades STNO phase stability, increasing its linewidth above the intrinsic limit for a linear oscillator set by thermal fluctuations.

The disclosed technology creates a method by which strongly non-linear effective damping of STNO amplitude fluctuations is produced and employed to greatly reduce if not completely eliminate the non-linear coupling between such amplitude fluctuations and the STNO phase. The result is a STNO with greatly increased phase stability over previous STNO designs. This disclosed technology embodied through the application of any one of a variety of means of applying a spatially non-uniform spin torque to the active, magnetically oscillating element in the STNO device. The effect of this non-uniform spin torque is first to excite the magnetic element through the transfer of spin angular momentum from an incident spin-polarized current, or alternatively from a pure spin current generated by the spin Hall effect, or some other means. This spin transfer provides an anti-damping torque to the element and at sufficiently strong current levels excites it into persistent magnetic oscillation. These oscillations are converted into electromagnetic signals through a magnetoresistance effect. Once the oscillation amplitude becomes large enough the spatial variation in the polarization direction of the incident spin polarized current, or pure spin current, is such that some portion of the oscillating element locally encounters a diminishing efficiency of anti-damping spin torque with increasing oscillation amplitude, or even experiences a damping spin torque that increases in strength with increasing oscillation amplitude. This has the effect of providing negative feedback to the oscillation, strongly suppressing power fluctuations and hence greatly enhancing the non-linear effective damping of the STNO oscillation power which reduces the non-linear coupling between amplitude and phase. When the non-linear effective damping is sufficiently strong, which is a level that depends on the spatially dependent details of the magnetic configuration of the oscillating element relative to the spatial distribution of the incident spin polarized current, or the incident spin current, the STNO can become quasi-linear with its phase stability, or equivalently, its intrinsic oscillation linewidth, very close to the limit set by fundamental thermal fluctuations, which is determined by the ratio of the oscillation time-averaged energy to the energy provided by random thermal impulses.

The disclosed technology realizes a non-linear response of the oscillation power of a spin torque nanoscale oscillator (STNO) to changes in the steady (dc) spin-polarized bias current, or alternatively to a pure spin bias current, that excites the steady-state oscillation, this non-linear response is such that the variation of power $p_0$ with bias current I above some value becomes sufficiently low so as to achieve an enhancement of the non-linear effective damping $\Gamma_{eff} \approx \Gamma_0 I/(dp_0/dI)$ of the STNO. This enhanced non-linear effective damping provides negative feedback to the oscillating element, suppressing oscillator power fluctuations and thereby substantially reducing the non-linear coupling constant v, potentially to v≤1 such that the spectral linewidth of the oscillator, or equivalently its phase stability, can be close to the fundamental limit set by intrinsic thermal fluctuations.

To achieve a much higher $\Gamma_{eff}$ the disclosed technology implements the general method whereby once the amplitude of the magnetic oscillation reaches a certain level, further increases in oscillation amplitude result in a reduction of the net effectiveness of the spin torque applied to the oscillating element. As the consequence, a fluctuation to a higher amplitude of oscillation results in a negative feedback where the power of the oscillator is quickly reduced due to the reduced overall efficiency of the overall applied anti-damping spin torque. Conversely, a fluctuation in oscillator amplitude to a lower level, results in a significantly increased efficiency of the applied spin torque, which results in the oscillator amplitude being quickly restored to the higher, steady state level. This negative feedback of power fluctuations provides the non-linear effective damping that together with a reasonable level of oscillator agility results in a quasi-linear STNO with greatly improved spectral linewidth, or equivalently phase stability. Thus the disclosed technology employs an anti-damping spin torque that is strongly and non-linearly dependent on oscillation amplitude to provide negative feedback and thus suppress power fluctuations in a STNO.

The disclosed technology includes employing internal negative feedback during the excitation of a STNO is implemented by the provision of a substantial spatial variation in the strength of the anti-damping spin-transfer torque that is exerted on the magnetically oscillating element by the incident spin polarized current or the pure spin current. Due to this spatial variation some region (regions) of the magnetically oscillating element receives (receive) a relatively strong excitation while another region (other regions) of the magnetically oscillating element receives a spin transfer torque that either diminishes in strength with oscillation amplitude, or due to the time-averaged orientation of the local magnetization relative to the polarization direction of the incident current receives a spin torque that has a positive damping effect once the overall oscillation power reaches a certain level. This can occur because the effectiveness or efficiency of spin transfer for generating anti-damping varies with the angle $\phi_0$ between the axis of precession and the direction of the incident net spin polarization.

Specifically the spin torque exerted by a spin current varies as $\sigma_{st} = \sigma_{st}(0) \sin \phi_0$, and the anti-damping effectiveness of this spin torque in exciting persistent magnetic oscillation is $\propto d\tau_{st}/d\phi_0 \approx \tau_{st}(0) \cos \phi_0$, where the angle $\phi_0$ is the angle between the direction of polarization of incident spin polarized current, or of the incident spin current, and the average, midpoint, orientation of the magnetization of the ferromagnetic element that is excited. As the result of this angular dependence, the spin torque effect is negative (anti-damping torque) for $\phi_0 > 90°$, goes to zero at $\phi_0 = 90°$ and becomes positive (damping torque) for $\phi_0 < 90°$. This spatially varying spin torque is utilized in the disclosed technology by establishing a device configuration where $\phi_0$ varies substantially across the excited element, such that in some area (areas) $\phi_0 >> 90°$ and in another area (other areas) it is decreased to $\phi_0$:90° or less. Then part of the element will experience a strong anti-damping excitation while the other area(s) with $\phi_0$:90° will, once driven into oscillation by a weaker anti-damping excitation in combination with the magnetic exchange coupling from the more strongly excited region, experience a rapid lessening of the anti-damping spin torque as the magnetic orientation of that weakly excited region rotates to an relative orientation where $\phi < 90°$. Note that the magnetic exchange interaction in a ferromagnetic material in general couples, to a degree quantified by the amplitude of an exchange coupling constant J, adjacent ionic magnetic moments such that a rotational displacement of one moment from its equilibrium magnetic orientation results in a torque being applied to the neighboring moments that acts to induce a similar rotation as that of the first moment. If a region of the oscillating free layer before the initiation of a spin current bias has a magnetic orientation relative to the polarization of the incident current such that $\phi_0 < 90°$ then it will not be directly excited by the incident spin current density but another region(s) where $\phi_0 ? 90°$ will be. Once the oscillation amplitude in this latter region(s) becomes strong enough that the exchange coupling through the magnetic layer begins to excite a significant oscillation in the region where $\phi_0 < 90°$, that will result in an overall increased damping to the oscillation due to the damping spin torque effect exerted there. This non-linear enhanced effective damping can be further increased if the orientation of the axis of precession $\phi_0$ decreases with the amplitude of the applied bias current, $d\phi_0/dI<0$. This is generally the case if the magnetic configuration is such that over at least some region of the oscillating element the orientation is such that $90°\leq\phi_0<<180°$ before the application of the spin polarized bias current. A decrease in $\phi_0$ with increased bias current is equivalent to a decrease in spin torque effectiveness with increasing oscillation amplitude (power), and this provides enhanced effective damping that suppresses power fluctuations.

The disclosed technology can be embodied in any one of a number of ways. In one such embodiment, the disclosed technology includes a magnetic spin valve structure. In this embodiment there is a thick or otherwise magnetically pinned or fixed ferromagnetic layer. Electrons in a current passing through or reflecting from this fixed layer become spin polarized. When this spin polarized current passes through a normal metal conducting layer, such a Cu, and impinges onto a second, thinner ferromagnetic layer, referred to as the "free layer" (FL), the absorption of the spin angular momentum that is transverse to the local magnetization orientation of the free layer exerts a torque on the free layer. If the direction of the transverse spin polarization of the impinging current is of the correct sign, this torque has the effect of opposing the intrinsic magnetic torque that causes damping of any magnetic excitation in the free layer, that is, the absorption of the transverse spin angular momentum has the effect of an "anti-damping" torque. When the incident spin polarized current is sufficiently large the free layer is excited into persistent magnetic oscillation by this spin torque. The steady state amplitude of this persistent oscillation is determined by the time-averaged balance between the magnetic damping and the anti-damping, with the total time-averaged damping, that is the sum of the positive damping torque and the negative anti-damping, being zero. The magnetic oscillation is detected in this embodiment of the disclosed technology by the magnetoresistance of the spin valve structure where the electrical resistance to current flow between the two ferromagnetic layers depends on the relative orientation of the local magnetizations of the two layers opposite each other.

While this patent document contain many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A spin-torque oscillator device for generating an RF or microwave oscillation signal, comprising:
   a substrate;
   a magnetic spin-torque structure formed on the substrate and structured to include a multi-layer stack of layers on the substrate to exhibit a spin-torque effect, wherein the multi-layer stack is shaped to have a shape anisotropy in each layer and includes a thin magnetic free layer and a thick magnetic reference layer;
   a circuit coupled to the magnetic spin-torque structure to apply a DC bias current to flow through the magnetic spin-torque structure; and
   a magnetic field module configured to apply a bias magnetic field to the magnetic spin-torque structure,
   wherein the magnetic spin-torque structure, the DC bias current and the bias magnetic field are configured to control a magnetic precession in the magnetic spin-torque structure to convert the DC bias current into an RF or microwave oscillation signal and effectuate a negative spin torque feedback to reduce a coupling between an amplitude and an oscillation frequency of the RF or microwave signal, and wherein the magnetic field module is structured to apply the bias magnetic field to the magnetic spin-torque structure below a magnetic field threshold value that produces a relatively uniform internal field distribution, thus causing the RF or microwave oscillation signal to be in a single mode.

2. The device as in claim 1, wherein
the circuit is coupled to the magnetic spin-torque structure to apply the DC bias current to flow through the magnetic spin-torque structure in a direction substantially perpendicular to the layers.

3. The device as in claim 1, wherein:
the magnetic field module is configured to vary a magnitude of the bias magnetic field to tune an oscillation frequency of the RF or microwave oscillation signal produced by the magnetic spin-torque structure.

4. The device as in claim 3, wherein:
the circuit is configured to vary a magnitude of the DC bias current to tune an oscillation frequency of the RF or microwave oscillation signal produced by the magnetic spin-torque structure.

5. The device as in claim 1, wherein:
the circuit is configured to vary a magnitude of the DC bias current to tune an oscillation frequency of the RF or microwave oscillation signal produced by the magnetic spin-torque structure.

6. The device as in claim 1, wherein:
the multi-layer stack is elliptically shaped and the bias magnetic field includes a magnetic field component along a short axis of the elliptically shaped thin magnetic free layer and thick magnetic reference layer.

7. The device as in claim 1, wherein:
the multi-layer stack is elongated in shape and the bias magnetic field includes a magnetic field component that is perpendicular to an elongated direction of and is within a plane of the thin magnetic free layer and thick magnetic reference layer.

8. The device as in claim 1, wherein:
the thick magnetic reference layer of the multi-layer stack has a tapered shape along a direction perpendicular to the thick magnetic reference layer.

9. The device as in claim 1, wherein:
the multi-layer stack includes a conductive spacer layer between the thin magnetic free layer and thick magnetic reference layer to form a spin valve structure.

10. The device as in claim 1, wherein:
the multi-layer stack is configured to position the thin magnetic free layer closer to the substrate than the thick magnetic reference layer.

11. The device as in claim 10, wherein:
the multi-layer stack is configured to have an aspect ratio of a shape of the thin magnetic free layer to be smaller than an aspect ratio of a shape of the thick magnetic reference layer.

12. A method for generating a tunable RF or microwave oscillation signal from a magnetic spin-torque structure that includes a multi-layer stack of layers including a magnetic free layer and a magnetic reference layer spaced from each other and shaped to have a shape anisotropy to exhibit a spin-torque effect and a magnetic precession in the magnetic spin-torque structure under a bias magnetic field, the method comprising:
applying a DC bias current to flow through the magnetic spin-torque structure;
applying a bias magnetic field to the magnetic spin-torque structure to include a bias magnetic field component that is in a plane of the magnetic free layer and perpendicular to an elongated direction of the magnetic free layer; and
controlling the DC bias current and the bias magnetic field to apply a spatially non-uniform spin torque to control a magnetic precession in the magnetic spin-torque structure to convert the DC bias current into an RF or microwave oscillation signal and to reduce a coupling between an amplitude and an oscillation frequency of the RF or microwave oscillation signal.

13. The method as in claim 12, comprising:
adjusting the DC bias current to tune an oscillation frequency of the RF or microwave oscillation signal produced by the magnetic spin-torque structure.

14. The method as in claim 12, comprising:
adjusting the bias magnetic field to tune an oscillation frequency of the RF or microwave oscillation signal produced by the magnetic spin-torque structure.

15. The method as in claim 12, comprising:
adjusting both the DC bias current and the bias magnetic field to tune an oscillation frequency of the RF or microwave oscillation signal produced by the magnetic spin-torque structure.

16. The method as in claim 12, comprising:
controlling the DC bias current or the bias magnetic field to achieve a desired reduction of the coupling between an amplitude and an oscillation frequency of the RF or microwave oscillation signal.

17. The method as in claim 12, comprising:
controlling the DC bias current and the bias magnetic field to achieve a desired reduction of the coupling between an amplitude and an oscillation frequency of the RF or microwave oscillation signal.

18. The method as in claim 12, comprising:
controlling the bias magnetic field to be within a magnetic field range to achieve a desired reduction in the coupling between the amplitude and the oscillation frequency of the RF or microwave oscillation signal.

19. The method as in claim 12, comprising:
controlling the DC bias current to be within a range to achieve a desired reduction in the coupling between the amplitude and the oscillation frequency of the RF or microwave oscillation signal.

20. The method as in claim 12, wherein:
the magnetic reference layer of the multi-layer stack has a tapered shape along a direction perpendicular to the magnetic reference layer.

21. The method as in claim 12, wherein:
the multi-layer stack includes a conductive spacer layer between the magnetic free layer and magnetic reference layer to form a spin valve structure.

22. The method as in claim 12, wherein:
the multi-layer stack is configured to position the magnetic free layer closer to an underlying substrate than the magnetic reference layer.

23. The method as in claim 12, comprising:
using the multi-layer stack as a magnetic sensor to measure a change in the bias magnetic field by measuring a change in the RF or microwave signal.

24. A spin-torque oscillator device for generating an RF or microwave oscillation signal, comprising
a substrate;
a magnetic spin-torque structure formed on the substrate and structured to include a multi-layer stack of layers on the substrate to exhibit a spin-torque effect, wherein the multi-layer stack is shaped to have a shape anisotropy in each layer and includes a magnetic free layer, a magnetic reference layer and a conductive spacer layer between the magnetic free layer and the magnetic reference layer, wherein the magnetic reference layer has a tapered shape along a direction perpendicular to the magnetic reference layer to produce a spatial variation in an orientation of a polarization of spins in the current along the magnetic free layer;
a circuit coupled to the magnetic spin-torque structure to apply a DC bias current to flow through the magnetic spin-torque structure; and
a magnetic field module configured to apply a bias magnetic field to the magnetic spin-torque structure,
wherein the magnetic spin-torque structure, the DC bias current and the bias magnetic field are configured based on the tapered shape of the magnetic reference layer to control a magnetic precession in the magnetic spin-torque structure to convert the DC bias current into an RF or microwave oscillation signal which has an oscillation frequency that is stabilized with respect to a change in a power of the RF or microwave signal.

25. The device as in claim 24, wherein:
the multi-layer stack is configured to position the magnetic free layer closer to an underlying substrate than the magnetic reference layer.

26. The device as in claim 24, wherein
the circuit is coupled to the magnetic spin-torque structure to apply the DC bias current to flow through the magnetic spin-torque structure in a direction perpendicular to the layers.

27. The device as in claim 24, wherein:
the magnetic field module is configured to vary a magnitude of the bias magnetic field to tune an oscillation frequency of the RF or microwave oscillation signal produced by the magnetic spin-torque structure.

28. The device as in claim 27, wherein:
the circuit is configured to vary a magnitude of the DC bias current to tune an oscillation frequency of the RF or microwave oscillation signal produced by the magnetic spin-torque structure.

29. The device as in claim 24, wherein:
the circuit is configured to vary a magnitude of the DC bias current to tune an oscillation frequency of the RF or microwave oscillation signal produced by the magnetic spin-torque structure.

30. The device as in claim 24, wherein:
the multi-layer stack is elongated in shape and the bias magnetic field includes a magnetic field component that is perpendicular to an elongated direction of and is within a plane of the thin magnetic free layer and thick magnetic reference layer.

\* \* \* \* \*

UNITED STATES PATENT AND TRADEMARK OFFICE
CERTIFICATE OF CORRECTION

PATENT NO. : 9,577,653 B2
APPLICATION NO. : 14/760999
DATED : February 21, 2017
INVENTOR(S) : Robert A. Buhrman, Oukjae Lee and Daniel C. Ralph Page 1 of 3

It is certified that error appears in the above-identified patent and that said Letters Patent is hereby corrected as shown below:

On the Title Page

In Item (60), Lines 1-2, delete "Jan. 13, 2013." and insert -- Jan. 14, 2013. --, therefor.

In the Specification

In Column 1, Line 7, delete "USC 371" and insert -- USC § 371 --, therefor.

In Column 1, Line 12, delete "disclosure" and insert -- disclosure of --, therefor.

In Column 3, Line 31, delete "PSD's" and insert -- PSDs --, therefor.

In Column 3, Line 49, delete "$H_d=00$" and insert -- $H_d=100$ --, therefor.

In Column 3, Line 51, delete "$I_{dc}$'s." and insert -- $I_{dcs}$. --, therefor.

In Column 4, Line 24, delete "10 b:" and insert -- 10b. --, therefor.

In Column 4, Line 50, delete "13c:" and insert -- 13c. --, therefor.

In Column 4, Line 61, delete "RL" and insert -- RL. --, therefor.

In Column 9, Line 10, delete "where" and insert -- Where --, therefor.

In Column 10, Line 2, delete "result" and insert -- result in --, therefor.

In Column 10, Line 25, delete "(PSD's)" and insert -- (PSDs) --, therefor.

In Column 10, Line 30, delete "Δf's" and insert -- Δfs --, therefor.

Signed and Sealed this
Seventh Day of August, 2018

Andrei Iancu
*Director of the United States Patent and Trademark Office*

CERTIFICATE OF CORRECTION (continued)
U.S. Pat. No. 9,577,653 B2

In Column 10, Line 42, delete "off" and insert -- of f, --, therefor.

In Column 10, Line 44, delete "PSD's" and insert -- PSDs --, therefor.

In Column 13, Line 28, delete "STNO's," and insert -- STNOs, --, therefor.

In Column 14, Line 9, delete "(S1)" and insert the same at Line 6, after Equation, as a continuation paragraph.

In Column 14, Line 9, delete "where" and insert -- Where --, therefor.

In Column 14, Line 23, delete "following," and insert -- following: --, therefor.

In Column 14, Line 30, delete "(S3)" and insert the same at Line 26, after Equation, as a continuation paragraph.

In Column 14, Line 49, delete "(S5)" and insert the same at Line 45, after Equation, as a continuation paragraph.

In Column 15, Line 35, delete "is th" and insert -- is the --, therefor.

In Column 16, Line 44, delete "e is" and insert -- $\epsilon$ is --, therefor.

In Column 17, Line 2, delete "For" and insert -- For $\theta RL<0°$ --, therefor.

In Column 17, Line 43, after Equation, insert -- , --.

In Column 17, Line 44, delete "(S8)," and insert -- (S8) --, at Line 43, after Equation, as a continuation paragraph.

In Column 17, Line 44, delete "His" and insert -- H is --, therefor.

In Column 17, Line 46, after Equation, insert -- , --.

In Column 17, Line 47, delete "(S9)," and insert -- (S9) --, at Line 46, after Equation, as a continuation paragraph.

In Column 18, Line 44, delete "(H)" and insert -- ($H_{oe}$) --, therefor.

In Column 18, Lines 62-63, delete ""easy axis"" and insert -- "easy axis" --, therefor.

In Column 21, Line 66, delete "FIG. 10b-d." and insert -- FIGS. 10b-d. --, therefor.

In Column 22, Line 7, delete "$\Delta_{meas}$" and insert -- $\Delta f_{meas}$ --, therefor.

In Column 23, Line 45, delete "precression" and insert -- precession --, therefor.

In the Claims

In Column 32, Line 37, in Claim 2, delete "wherein" and insert -- wherein: --, therefor.

In Column 34, Line 25, in Claim 24, delete "comprising" and insert -- comprising: --, therefor.

In Column 34, Line 58, in Claim 26, delete "wherein" and insert -- wherein: --, therefor.